US012563862B2

(12) United States Patent　　(10) Patent No.:　US 12,563,862 B2
Kirmani et al.　　　　　　　　　　(45) Date of Patent:　　Feb. 24, 2026

(54) ULTRALIGHT-WEIGHT PROTECTIVE BARRIERS FOR SPACE-BASED PEROVSKITE PHOTOVOLTAICS

(71) Applicant: Alliance for Energy Innovation, LLC, Golden, CO (US)

(72) Inventors: Ahmad Rasa Kirmani, Lakewood, CO (US); Joseph Matthew Luther, Boulder, CO (US); David Paul Ostrowski, Denver, CO (US)

(73) Assignee: Alliance for Energy Innovation, LLC, Golden, CO (US)

( * ) Notice: Subject to any disclaimer, the term of this patent is extended or adjusted under 35 U.S.C. 154(b) by 0 days.

(21) Appl. No.: 18/724,273

(22) PCT Filed: Jan. 20, 2023

(86) PCT No.: PCT/US2023/011246
§ 371 (c)(1),
(2) Date: Jun. 26, 2024

(87) PCT Pub. No.: WO2023/141275
PCT Pub. Date: Jul. 27, 2023

(65) Prior Publication Data
US 2025/0072163 A1　　Feb. 27, 2025

Related U.S. Application Data

(60) Provisional application No. 63/301,295, filed on Jan. 20, 2022.

(51) Int. Cl.
H10F 77/80　　　(2025.01)
H10F 19/80　　　(2025.01)
(Continued)

(52) U.S. Cl.
CPC ........... H10F 77/80 (2025.01); H10F 19/804 (2025.01); H10F 19/85 (2025.01); H10F 77/12 (2025.01)

(58) Field of Classification Search
CPC .......... H10F 77/80; H10F 77/12; H10F 19/85; H10F 19/804
See application file for complete search history.

(56) References Cited

U.S. PATENT DOCUMENTS

2005/0139783 A1*　6/2005　Kubota ................... G03B 42/08
　　　　　　　　　　　　　　　　　　　　　　250/484.4
2006/0166023 A1*　7/2006　Yoshikata ......... B32B 17/10018
　　　　　　　　　　　　　　　　　　　　　　428/702
(Continued)

FOREIGN PATENT DOCUMENTS

CN　　　　109065734 A　　12/2018
JP　　　2000307137 A　*　11/2000
(Continued)

OTHER PUBLICATIONS

JP-2000307137-A, Machine Translation (Year: 2000).*
(Continued)

*Primary Examiner* — Devina Pillay
(74) *Attorney, Agent, or Firm* — Michael A. McIntyre

(57)　　　　　　　　ABSTRACT

The present disclosure relates to a solar cell that includes a first layer that includes a semiconductor and a second layer that includes at least one of an oxide, a carbide, a nitride, a fluoride, and/or a sulfide, where the second layer covers a surface of the first layer, the second layer has a thickness between about 400 nm and about 10 μm, and the solar cell retains at least 95% of a starting power-conversion-efficiency (PCE) after exposure to a proton fluence of about
(Continued)

1E15 cm$^{-2}$ for protons having an energy between greater than zero KeV per proton and less than or equal to 0.05 KeV per proton.

17 Claims, 33 Drawing Sheets

(51) Int. Cl.
    *H10F 19/85*         (2025.01)
    *H10F 77/12*         (2025.01)

(56)          References Cited

U.S. PATENT DOCUMENTS

| | | | |
|---|---|---|---|
| 2017/0221639 A1 * | 8/2017 | Hayakawa | H10K 85/141 |
| 2017/0342316 A1 | 11/2017 | Luther et al. | |
| 2018/0142148 A1 * | 5/2018 | Park | C09K 11/668 |
| 2023/0039806 A1 * | 2/2023 | Greco | H10F 77/80 |

FOREIGN PATENT DOCUMENTS

| | | |
|---|---|---|
| WO | 2020/209921 A2 | 10/2020 |
| WO | 2021/113525 A1 | 6/2021 |

OTHER PUBLICATIONS

Ahangharnejhad et al., "Protecting Perovskite Solar Cells against Moisture-Induced Degradation with Sputtered Inorganic Barrier Layers", ACS Applied Energy Materials, 2021, vol. 4, Issue 8, pp. 7571-7578.

Anspaugh, "Proton and electron damage coefficients for GaAs/Ge solar cells", The Conference Record of the Twenty-Second IEEE Photovoltaic Specialists Conference, 1991, pp. 1593-1598.

Arshak et al., "Preliminary studies of properties of oxide thinthick films for gamma radiation dosimetry", Material Science and Engineering: B, 2004, vol. 107, Issue 2, pp. 224-232.

Barbe et al., "Radiation Hardness of Perovskite Solar Cells Based on Aluminum-Doped Zinc Oxide Electrode Under Proton Irradiation", Solar RRL , 2019, vol. 3, pp. 1900219.

Cardinaletti et al., "Organic and perovskite solar cells for space application", Organic and perovskite solar cells for space applications, Solar Energy Materials and Solar Cells, 2018, vol. 182, pp. 121-127.

Coskun et al., "Thermally evaporated two-dimensional SnS as an efficient and stable electron collection interlayer for inverted planar perovskite solar cells", 2019, Royal Society of Chemistry, vol. 7, pp. 4759-4765.

Huang et al., "y-ray Radiation on Flexible Perovskite Solar Cells", ACS Applied Energy Materials, 2020, vol. 3, Issue 8, pp. 7318-7324.

Kanaya et al., "Proton Irradiation Tolerance of High-Efficiency Perovskite Absorbers for Space Applications", The Journal of Physical Chemistry Letters, 2019, vol. 10, Issue 22, pp. 6990-6995.

Kim et al., "Inorganic Encapsulation Method Using Solution-Processible Polysilazane for Flexible Solar Cells", ACS Applied Energy Materials, 2020, vol. 3, pp. 9257-9263.

Lang et al., "Proton Radiation Hardness of Perovskite", Tandem Photovoltaics, 2022, vol. 4, Issue 5, 1054-1069.

Li et al., "Li dopant induces moisture sensitive phase degradation of an all-inorganic CsPbl2Br perovskite. Chemical Communications", 2018, vol. 54, Issue 70, pp. 9809-9812.

Manikanthababu et al., "Radiation tolerance, charge trapping, and defect dynamics studies of ALD-grown Al/HfO2/Si nMOSCAPs", Journal of Materials Science: Materials in Electronics, 2020, vol. 31, pp. 3312-3322.

Messenger et al., "Modeling solar cell degradation in space: A comparison of the NRL displacement damage dose and the JPL equivalent fluence approaches", Progress in Photovoltaics: Research and Applications, 2001, vol. 9, Issue 2, pp. 103-121.

Saliba et al., "Cesium-containing triple cation perovskite solar cells: improved stability, reproducibility and high efficiency", Energy & Environmental Science, 2016, vol. 9, Issue 6, pp. 1989-1997.

Tong et al., "Carrier lifetimes of >1 µs in Sn—Pb perovskites enable efficient all-perovskite tandem solar cells", 2019, vol. 364 Issue 6439, pp. 475-479.

Tu et al., "Perovskite Solar Cells for Space Applications: Progress and Challenges", Advanced Materials, 2021, vol. 33, pp. 2006545.

Yang et al., "Radiation tolerance of perovskite solar cells under gamma ray", Organic Electronics, vol. 71, 2019, pp. 79-84.

Zardetto et al., "Atomic layer deposition for perovskite solar cells: research status, opportunities and challenges", The Royal Society of Chemistry, 2017, vol. 1, pp. 30-55.

Ziegler et al., "SRIM—The stopping and range of ions in matter" Nuclear Instruments and Methods in Physics Research Section B: Beam Interactions with Materials and Atoms, 2010, vol. 268, Issue 11, pp. 1818-1823.

International Search Report and Written Opinion for International (PCT) Application No. PCT/US23/11246 date of mailing Apr. 27, 2023, pp. 1-5.

International Search Report and Written Opinion for International (PCT) Application No. PCT/US23/11246 date of mailing date Aug. 2, 2024, pp. 1-5.

* cited by examiner

200

230

220

210

A B X

A)

α-ABX₃

B)

β-ABX₃

C)

γ-ABX₃

A) 210 corner sharing
cubic phase/α-phase

230

B) 220 face sharing
hexagonal phase

C)

edge sharing
orthorhombic phase

A)

A)

B)

A)

B)

ULTRALIGHT-WEIGHT PROTECTIVE BARRIERS FOR SPACE-BASED PEROVSKITE PHOTOVOLTAICS

CROSS-REFERENCE TO RELATED APPLICATIONS

This application is a national stage entry from International Patent Application No. PCT/US23/11246 filed on Jan. 20, 2023, which claims priority from U.S. Provisional Patent Application No. 63/301,295 filed on Jan. 20, 2022, the contents of which are incorporated herein by reference in the entirety.

CONTRACTUAL ORIGIN

This invention was made with government support under Contract No. DE-AC36-08GO28308 awarded by the Department of Energy. The government has certain rights in the invention.

BACKGROUND

Solar cells deployed in space to power satellites and space missions are constantly bombarded with radiation that can significantly reduce the output power of these cells. One particularly damaging component of this radiation is the low-energy protons that create atomic displacements and defects in the solar cells. Solar technologies such as silicon and III-V materials currently used in space employ several-100 micron-thick cover glass layers to block these protons. Few, if any, lighter-weight barrier technologies exist. Overall, these conventional technologies are not suited for deep-space missions due to their large weight and performance degradation under the extreme radiation fields, necessitating the need for cost-prohibitive nuclear power. Deployment of satellites in the low-Earth orbit, set to exponentially increase in the next decade, also stands to significantly benefit from a lightweight low-cost barrier technology. Thus, there remains a need for better radiation barriers for solar cells used in space applications.

SUMMARY

An aspect of the present disclosure is a solar cell that includes a first layer that includes a semiconductor and a second layer that includes at least one of an oxide, a carbide, a nitride, a fluoride, and/or a sulfide, where the second layer covers a surface of the first layer, the second layer has a thickness between about 400 nm and about 10 $\mu$m, and the solar cell retains at least 95% of a starting power-conversion-efficiency (PCE) after exposure to a proton fluence of about 1E15 cm$^{-2}$ for protons having an energy between greater than zero KeV per proton and less than or equal to 0.05 KeV per proton. In some embodiments of the present disclosure, the solar cell may retain at least 99% of the starting PCE.

In some embodiments of the present disclosure, the semiconductor may include at least one of perovskite, silicon, CdTe, a CIGS alloy, a III-V alloy, and/or an organic material. In some embodiments of the present disclosure, the semiconductor may include a perovskite and the perovskite may have a crystalline structure defined by $ABX_3$, where A includes a first cation, B includes a second cation, and X includes an anion. In some embodiments of the present disclosure, the semiconductor may be in the form of a colloidal quantum dot.

In some embodiments of the present disclosure, the carbide may include at least one of a transition metal carbide and/or a metalloid carbide. In some embodiments of the present disclosure, the nitride may include at least one of a silicon nitride and/or a gallium nitride. In some embodiments of the present disclosure, the sulfide may include at least one of a zinc sulfide, a manganese sulfide, a cadmium sulfide, a lead sulfide, and/or an indium sulfide. In some embodiments of the present disclosure, the fluoride may include magnesium fluoride. In some embodiments of the present disclosure, the oxide may include at least one of a silicon oxide, an aluminum oxide, a hafnium dioxide, and/or a zirconium oxide.

In some embodiments of the present disclosure, the silicon oxide may include $SiO_x$, where $0 \leq x \leq 2$. In some embodiments of the present disclosure, x may be between 0.8 and 1.2, inclusively. In some embodiments of the present disclosure, x may be between 0.99 and 1.01, inclusively. In some embodiments of the present disclosure, the $SiO_x$ may have a density between about 2.1 g/cm$^3$ and about 2.3 g/cm$^3$, inclusively. In some embodiments of the present disclosure, the oxide may include at least one of SiO, $Al_2O_3$, $ZrO_2$, and/or $HfO_2$.

BRIEF DESCRIPTION OF DRAWINGS

Some embodiments are illustrated in referenced figures of the drawings. It is intended that the embodiments and figures disclosed herein are to be considered illustrative rather than limiting.

REFERENCE NUMERALS

Figure 1:
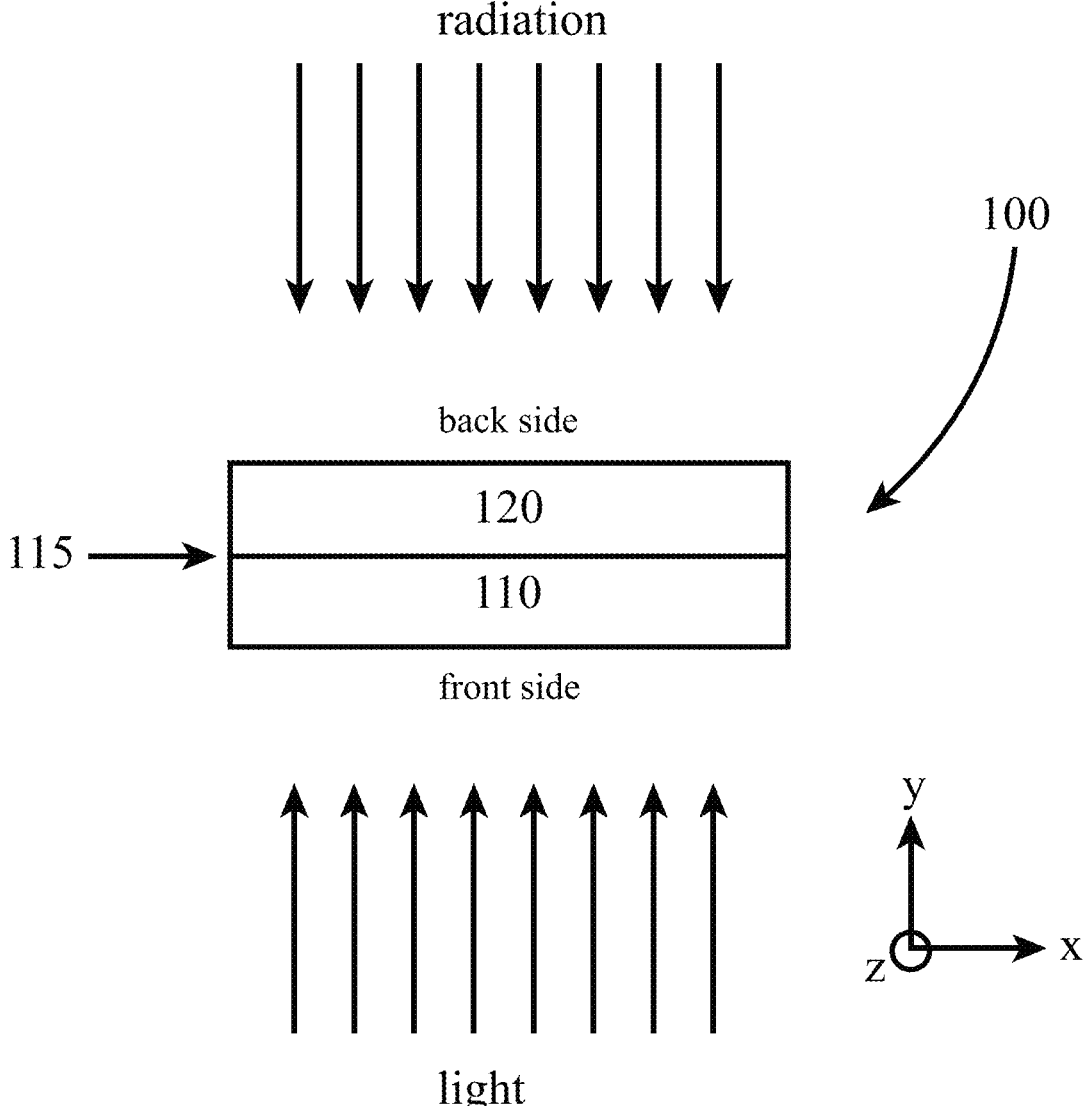
FIG. 1 illustrates a device according to some embodiments of the present disclosure.

100 . . . device
110 . . . first layer
115 . . . surface
120 . . . second layer
200 . . . perovskite
210 . . . A-cation
220 . . . B-cation
230 . . . X-anion

DETAILED DESCRIPTION

The embodiments described herein should not necessarily be construed as limited to addressing any of the particular problems or deficiencies discussed herein. References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the terms "about" or "approximately" are used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

The present disclosure relates to a barrier for solar cells deployed in space, including perovskite solar cells, although terrestrial-based solar cells may also benefit from the barrier layers described herein. Among other things, the technology reduces the current encapsulant payload weight by as much as 99.5%, making space launch, at least for the case of perovskite solar panels, low-cost and efficient. Significant weight reductions may also be achievable for other photovoltaic (PV) materials, including silicon, CdTe, III-V alloys, CIGS, etc. As shown herein, in some embodiments of the present disclosure, some barriers are constructed of metal-oxide films having thicknesses of up to about one micron, deposited via thermal evaporation directly onto perovskite solar cells. These barrier layers are shown herein, both by modeling and experimental data, to prevent and/or reduce degradation from low-energy protons, alpha particles, and/or atomic oxygen that can severely harm solar panels in space. Due to perovskites' lower weights compared to incumbent technologies such as silicon and III-V alloys, the combination of the barrier layers described herein with perovskite PV materials is an especially attractive combination for future solar cell modules intended for use in space.

FIG. 1 illustrates a device 100, e.g., a solar cell and/or solar cell module, according to some embodiments of the present disclosure. In this example, the device 100 includes a first layer 110 constructed to include a semiconductor (not shown) and a second layer 120, i.e., a barrier layer, constructed to include at least one of an oxide, a carbide, a nitride, a fluoride, and/or a sulfide. The second layer 120, the barrier layer, is positioned to cover a surface 115 of the first layer 110, i.e., the semiconductor-containing layer, where the surface 115 can receive radiation. As shown herein, a second layer 120 constructed of the materials described herein and having a thickness (in the y-axis direction) between about 400 nm and about 10 µm, or between about 400 nm and about 1 µm, or between about 800 nm and about 1200 nm can block a significant portion of the incoming radiation (e.g., protons), thereby minimizing the radiation-induced damage occurring to the underlying first layer 110. Note that radiation in space can come from all directions to impinge upon a solar cell, whereas the light, e.g., sunlight, powering the solar cell may come from essentially only one direction. Typically, a solar cell will have its "front side", the side receiving light to generate electricity is protected from radiation by a transparent glass substrate. So, this side of a device 100, the "front side", does not typically require a protective layer to shield the device 100 from radiation. However, the "back side" of a solar cell positioned in space may still need some kind of protective barrier to shield it from radiation. The second layer 120 illustrated in FIG. 1 provides such a barrier.

As a result, devices like that shown in FIG. 1, e.g., solar cells and/or solar modules, may retain at least 95% of a starting power-conversion-efficiency (PCE) after exposure to a proton fluence of about 1E15 cm$^{-2}$ for protons having an energy between about 10 KeV per proton to 300 KeV per proton, and at least 95% of starting PCE after exposure to an alpha particle fluence of about 1E12 cm$^{-2}$ for alpha particles having an energy between about 1 MeV per alpha to 2 MeV per alpha. A 1E15 cm$^{-2}$ fluence of 0.05 MeV protons corresponds to the total radiation an object would receive over a period of about 10,000 years, while in the lower earth orbit (LEO) of the International Space Station, e.g., less than 1000 km.

Referring again to FIG. 1, the device 100 is illustrated to show two distinct layers; a first layer 110 that includes a semiconductor layer and a second layer 120, i.e., a barrier layer, positioned adjacent to the first layer 110 with physical contact occurring at the surface 115 of the first layer 110. However, FIG. 1 specifically illustrates only two layers for simplicity and each of the first layer 110 and/or the second layer 120 may be a composite stack having more than one layer. For example, the first layer 110 including a semiconductor material may include at least five distinct layers: a first current collector, a hole-transport layer, an active layer (i.e., semiconductor-containing layer), an electron-transport layer, and/or a second current collector. So, what layer the second layer 120, barrier layer, contacts will depend on the specific device architecture making up the first layer 110. Again, for simplicity, the complexity of a photovoltaic stack, i.e., a composite first layer 110, is simplified and referred to herein as a "first layer".

In some embodiments of the present disclosure, a semiconductor material used to construct a first layer 110 may include at least one of a perovskite, silicon, CdTe, a CIGS alloy, and/or a III-V alloy. In some embodiments of the present disclosure, a semiconductor material used to construct a first layer 110 may be in the form of a colloidal quantum dot. As described above, a number of materials may be used to construct a second layer 120 to protect the underlying first layer 110, including at least one of an oxide, a nitride, a carbide, a sulfide, and or a fluoride-containing material. In some embodiments of the present disclosure, an oxide may include at least one of a silicon oxide, an aluminum oxide, a hafnium oxide, and/or a zirconium oxide. In some embodiments of the present disclosure, a second layer 120 (i.e., barrier layer) may be constructed of a carbide, for example a transition metal carbide or metalloid carbide. Examples of transition metal carbides include at least one of a titanium carbide, a zirconium carbide, a hafnium carbide, a vanadium carbide, a niobium carbide, a tantalum carbide, a chromium carbide, a molybdenum carbide, and/or a tungsten carbide. Examples of metalloid carbides include at least one of silicon carbide, germanium carbide, and tellurium carbide. In some embodiments of the present disclosure, a second layer 120 (i.e., barrier layer) may be constructed of a nitride, for example at least one of a silicon nitride and/or a gallium nitride. In some embodiments of the present disclosure, a second layer 120 (i.e., barrier layer) may be constructed of a sulfide, for example at least one of a zinc sulfide, a manganese sulfide, a cadmium sulfide, a lead sulfide, and/or an indium sulfide ($In_2S_3$). In some embodiments of the present disclosure, a second layer 120 (i.e., barrier layer) may be constructed of a fluoride-containing material, for example a magnesium fluoride.

In some embodiments of the present disclosure, a second layer 120 may be deposited onto a first layer 110, where the first layer 110 includes a perovskite and the second layer 120 includes a silicon oxide, wherein the second layer 120 provides a protective barrier for the underlying first layer 110. As used herein, the term "silicon oxide" refers an oxide of silicon having the stoichiometry defined by $SiO_x$, where $0 \leq x \leq 2$. In some embodiments of the present disclosure, a silicon oxide layer, as a second layer 120, may have an average stoichiometry of x equal to one, i.e., SiO, silicon monoxide. In some embodiments of the present disclosure, the value of x may be x=1±0.2, or x=1±0.19, x=1±0.18, or x=1±0.17, or x=1±0.16, or x=1±0.15, or x=1±0.14, or x=1±0.13, or x=1±0.12, or x=1±0.11, or x=1±0.10, or x=1±0.09, or x=1±0.08, or x=1±0.07, or x=1±0.06, or x=1±0.05, or x=1±0.04, or x=1±0.03, or x=1±0.02, or x=1±0.01. In other words, x may be between 0.8 and 1.2, or between 0.81 and 1.19, or between 0.82 and 1.18, or between 0.83 and 1.17, or between 0.84 and 1.16, or between 0.85 and 1.15, or between 0.86 and 1.14, or between 0.87 and 1.13, or between 0.88 and 1.12, or between 0.89 and 1.11, or between 0.90 and 1.10, or between 0.91 and 1.09, or between 0.92 and 1.08, or between 0.93 and 1.07, or between 0.94 and 1.06, or between 0.95 and 1.05, or between 0.96 and 1.04, or between 0.97 and 1.03, or between 0.98 and 1.02, or between 0.99 and 1.01.

As shown herein, in some embodiments of the present disclosure, a device 100 configured to include a barrier layer (i.e., second layer 120) may retain at least 95%, 96%, 97%, 98%, 99% or optionally 99.9% of its starting PCE after exposure to radiation having a 1E15 cm⁻² fluence of 0.05 MeV protons. In some embodiments of the present disclosure, a first layer 110 of a device 100 may be constructed to include a photovoltaic material that includes a perovskite.

Figure 2A:
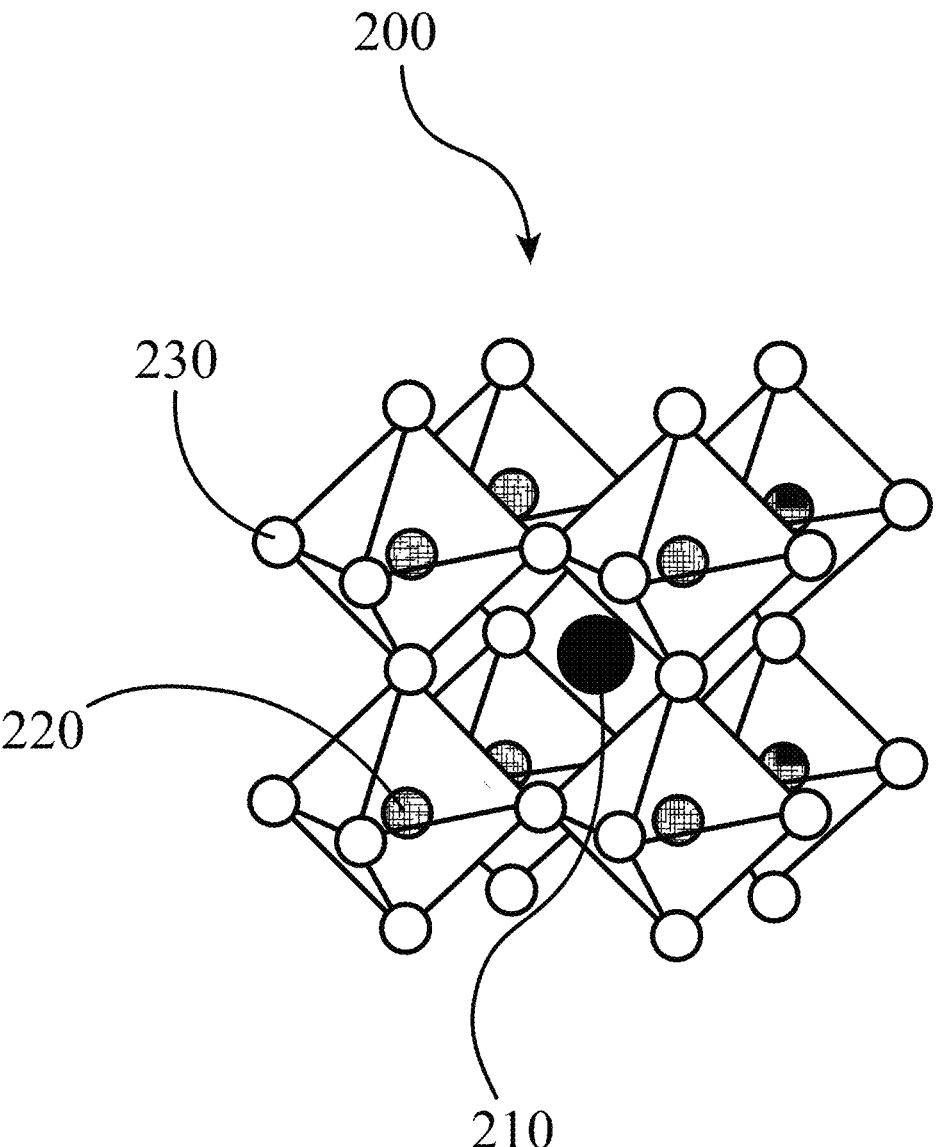
FIGS. 2A and 2B illustrate a perovskite in a corner-sharing, cubic phase arrangement, according to some embodiments of the present disclosure.
Figure 2B:
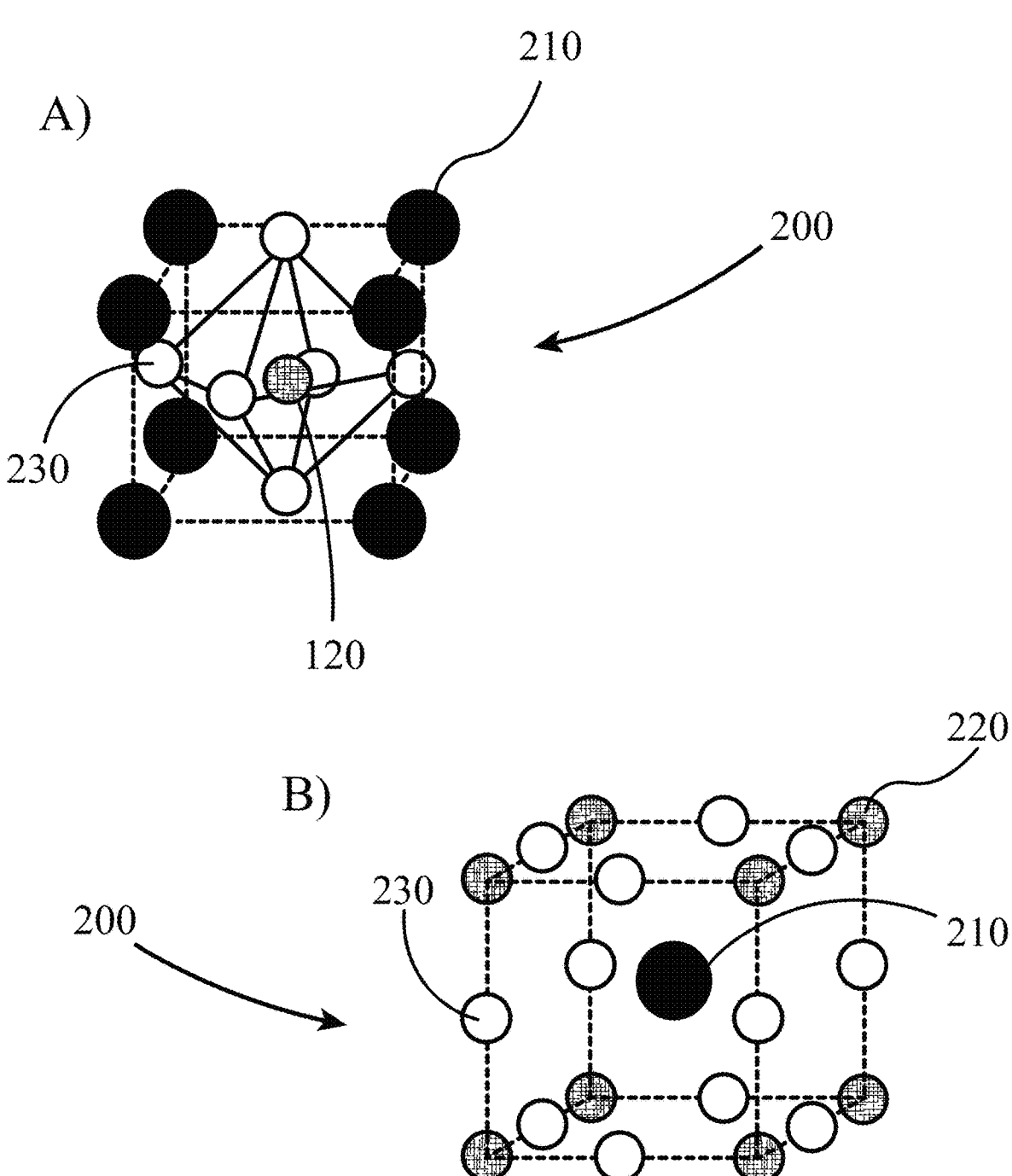

In general, the term "perovskite" refers to compositions having a network of corner-sharing $BX_6$ octahedra resulting in the general stoichiometry of $ABX_3$. FIGS. 2A and 2B illustrate that perovskites 200, for example metal halide perovskites, may organize into a three-dimensional (3D) cubic crystalline structures (i.e., α-phase or α-$ABX_3$) constructed of a plurality of corner-sharing $BX_6$ octahedra. In the general stoichiometry for a perovskite, $ABX_3$, X (230) is an anion and A (210) and B (220) are cations, typically of different sizes. FIG. 2A illustrates that a perovskite 200 having an α-phase structure may be further characterized by eight $BX_6$ octahedra surrounding a central A-cation 210, where each octahedra is formed by six X-anions 230 surrounding a central B-cation 220 and each of the octahedra are linked together by "corner-sharing" of anions, X (230).

Panel A of FIG. 2B provides another visualization of a perovskite 200 in the α-phase, also referred to as the cubic phase. This is because, as shown in FIG. 2B, a perovskite in the α-phase may be visualized as a cubic unit cell, where the B-cation 220 is positioned at the center of the cube, an A-cation 210 is positioned at each corner of the cube, and an X-anion 230 is face-centered on each face of the cube. Panel B of FIG. 2B provides another visualization of the cubic unit cell of an α-phase perovskite, where the B-cation 220 resides at the eight corners of a cube, while the A-cation 210 is located at the center of the cube and with 12 X-anions 230 centrally located between B-cations 220 along each edge of the unit cell. For both unit cells illustrated in FIGS. 2B, the A-cations 210, the B-cations 220, and the X-anions 230 balance to the general formula $ABX_3$ of a perovskite, after accounting for the fractions of each atom shared with neighboring unit cells. For example, referring to Panel A of FIG. 2B, the single B-cation 220 atom is not shared with any of the neighboring unit cells. However, each of the six X-anions 230 is shared between two unit cells, and each of the eight A-cations 210 is shared between eight unit cells. So, for the unit cell shown in Panel A of FIG. 2B, the stoichiometry simplifies to B=1, A=8*0.125=1, and X=6*0.5=3, or $ABX_3$. Similarly, referring again to Panel B of FIG. 2B, since the A-cation is centrally positioned, it is not shared with any of the unit cells neighbors. However, each of the 12 X-anions 230 is shared between four neighboring unit cells, and each of the eight B-cations 220 is shared between eight neighboring unit cells, resulting in A=1, B=8 *0.125=1, and X=12*0.25=3, or $ABX_3$. Referring again to Panel B of FIG. 2B, the X-anions 230 and the B-cations 220 of a perovskite in the α-phase are aligned along an axis; e.g., where the angle at the X-anion 230 between two neighboring B-cations 220 is exactly 180 degrees, referred to herein as the tilt angle. However, as shown in FIG. 3A, a perovskite 200 may assume other corner-sharing crystalline phases having tilt angles not equal to 180 degrees.

Figure 3A:
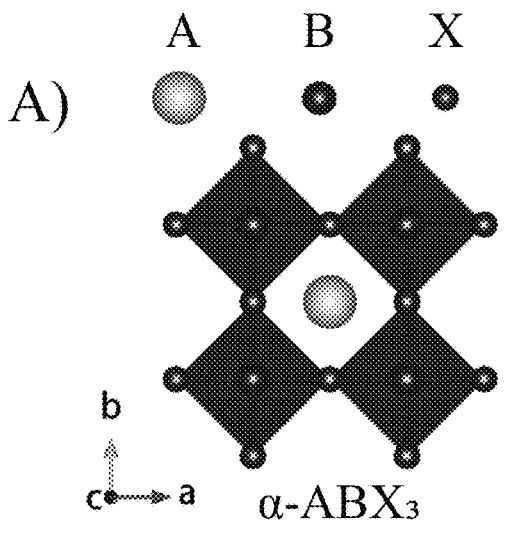
FIG. 3A illustrates three possible corner-sharing phases for perovskites, Panel A) cubic phase (i.e., $\alpha$-$ABX_3$), Panel B) a tetragonal crystalline phase (i.e., $\beta$-$ABX_3$), and Panel C) an orthorhombic crystalline phase (i.e., $\gamma$-$ABX_3$), according to some embodiments of the present disclosure.
Figure 3A:
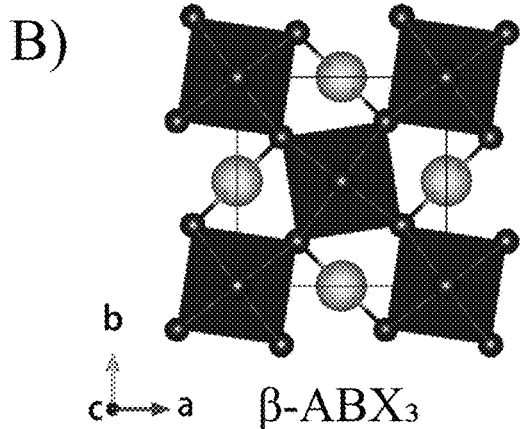
Figure 3A:
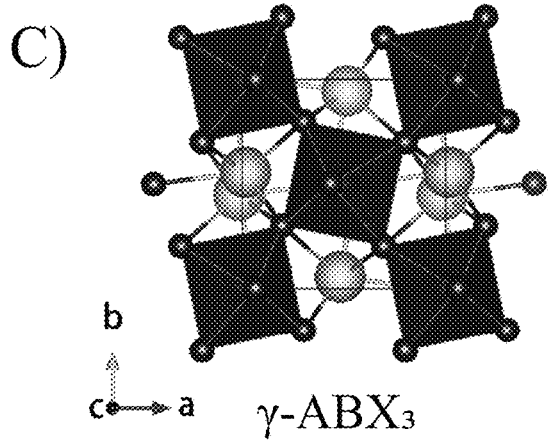

FIG. 3A illustrates that a perovskite can assume other crystalline forms while still maintaining the criteria of an $ABX_3$ stoichiometry with neighboring $BX_6$ octahedra maintaining X anion (230) corner-sharing. Thus, in addition to α-$ABX_3$ perovskites (in the cubic phase) having a tilt angle of 180 degrees, shown in Panel A of FIG. 3A, a perovskite may also assume a tetragonal crystalline phase (i.e., β-$ABX_3$) (see Panel B of FIG. 3A) and/or an orthorhombic crystalline phase (i.e., γ-$ABX_3$) (see Panel C of FIG. 3A), where the adjacent octahedra are tilted relative to the reference axes a, b, and c.

Figure 3B:
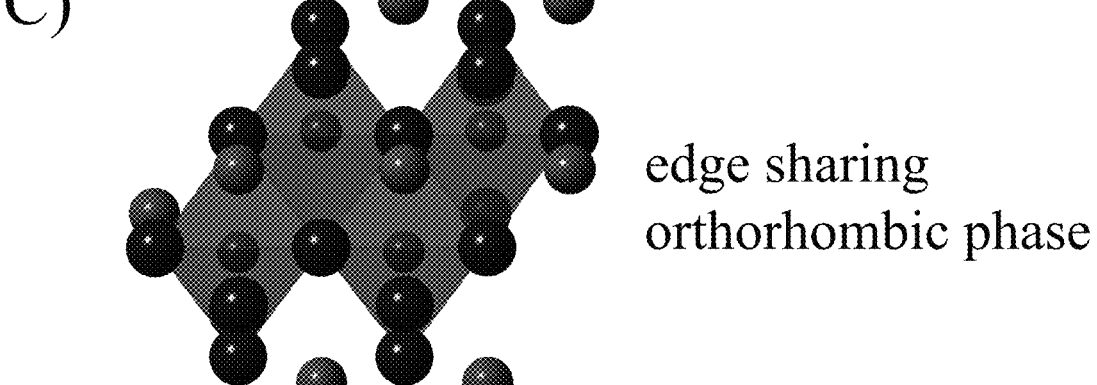
FIG. 3B illustrates a perovskite in one of the three possible phases, the cubic phase (i.e., $\alpha$-phase), compared to two non-perovskite phases (i.e., non-corner sharing), according to some embodiments of the present disclosure.

FIG. 3B illustrates that the elements used to construct a perovskite, as described above, A-cations 210, B-cations 220, and X-anions 230, may result in 3D non-perovskite structures; i.e., structures where neighboring $BX_6$ octahedra are not X-anion 230 corner-sharing and/or do not have a unit structure that simplifies to the $ABX_3$ stoichiometry. Referring to FIG. 3B, Panel A illustrates a perovskite in the cubic phase, i.e., $\alpha$-$ABX_3$, compared to a non-perovskite structure constructed of face-sharing $BX_6$ octahedra resulting in a hexagonal crystalline structure (see Panel B of FIG. 3B) and a non-perovskite structure constructed of edge-sharing $BX_6$ octahedra resulting in an orthorhombic crystalline structure (see Panel C of FIG. 3B).

Figure 4:
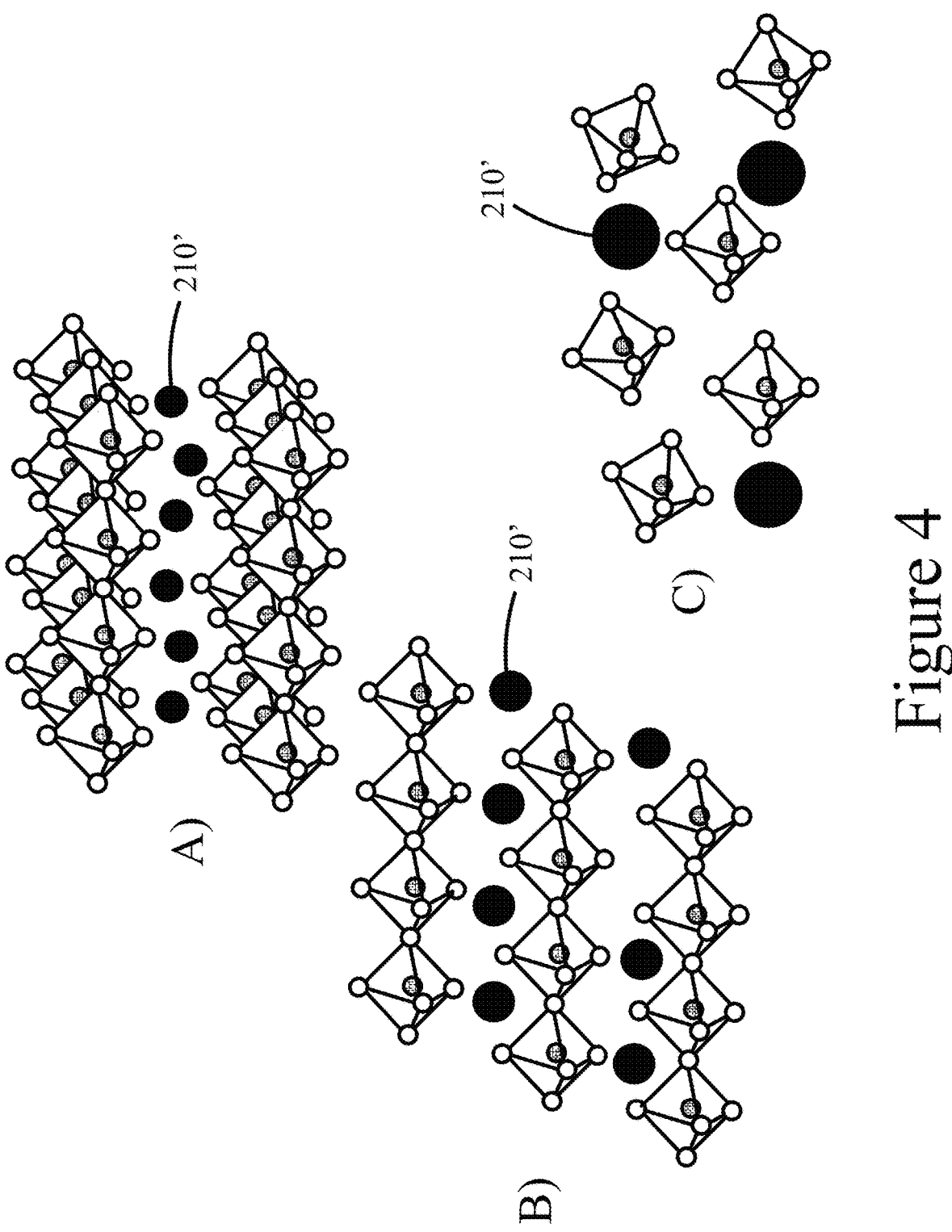
FIG. 4 illustrates 2D, 1D, and 0D perovskite-like structures, in Panels A), B), and C), respectively, according to some embodiments of the present disclosure.

Further, referring now to FIG. 4, the elements used to construct a perovskite, as described above, A-cations 210, B-cations 220, and X-anions 230, may result in non-3D (i.e., lower dimensional structures) perovskite-like structures such as two-dimensional (2D) structures, one-dimensional (1D) structures, and/or zero-dimensional (0D) structures. As shown in FIG. 4, such lower dimensional, perovskite-like structures still include the $BX_6$ octahedra, and depending on the dimensionality, e.g., 2D or 1D, may still maintain a degree of X-anion corner-sharing. However, as shown in FIG. 3, the X-anion 230 corner-sharing connectivity of neighboring octahedra of such lower dimensional structures, i.e., 2D, 1D, and 0D, is disrupted by intervening A-cations 210. Such a disruption of the neighboring octahedra, can be achieved by, among other things, varying the size of the intervening A-cations 210.

Referring to Panel A of FIG. 4, a 3D perovskite may be transformed to a 2D perovskite-like structure, 1D perovskite-like structure, and/or 0D perovskite-like structure. Where the degree of X-anion 230 corner sharing decreases and the stoichiometry changes according to the formula $(A')_m(A)_{n-1}B_nX_{3n+1}$, where monovalent (m=2) or divalent (m=1) A' cations 210' can intercalate between the X-anions of 2D perovskite-like sheets. Referring to Panel B of FIG. 4, 1D perovskite-like structures are constructed by $BX_6$ octahedral chained segments spatially isolated from each other by surrounding bulky organic A'-cations 210', leading to bulk assemblies of paralleled octahedral chains. Referring to Panel C of FIG. 4, typically, the 0D perovskite-like structures are constructed of isolated inorganic octahedral clusters and surrounded by small A'-cations 210', which may be connected via hydrogen bonding. In general, as n approaches infinity the structure is a pure 3D perovskite and when n is equal to 1, the structure is a pure 2D perovskite-like structure. More specifically, when n is greater than 10 the structure is considered to be essentially a 3D perovskite material and when n is between 1 and 5, inclusively, the structure is considered substantially a 2D perovskite-like material.

For simplification, as used herein the term "perovskite" will refer to each of the structures illustrated in FIGS. 2A through 4, unless specified otherwise. Thus, unless specified otherwise, the term "perovskite" as used herein includes each of a true corner-sharing $ABX_3$ perovskite, as illustrated in FIGS. 2A-2B and Panel A of FIG. 3A, as well as perovskite-like compositions having 0D, 1D, and/or 2D structures like those shown in FIG. 4, as well as non-perovskites as illustrated in FIG. 3B.

In some embodiments of the present invention, the A-cation 210 may include a nitrogen-containing organic compound such as an alkyl ammonium compound. The B-cation 220 may include a metal and the X-anion 230 may include a halogen. Additional examples for the A-cation 210 include organic cations and/or inorganic cations, for example Cs, Rb, K, Na, Li, and/or Fr. Organic A-cations 210 may be an alkyl ammonium cation, for example a $C_{1-20}$ alkyl ammonium cation, a $C_{1-6}$ alkyl ammonium cation, a $C_{2-6}$ alkyl ammonium cation, a $C_{1-5}$ alkyl ammonium cation, a $C_{1-4}$ alkyl ammonium cation, a $C_{1-3}$ alkyl ammonium cation, a $C_{1-2}$ alkyl ammonium cation, and/or a $C_1$ alkyl ammonium cation. Further examples of organic A-cations 210 include methylammonium ($CH_3NH_3^+$), ethylammonium ($CH_3CH_2NH_3^+$), propylammonium ($CH_3CH_2CH_2NH_3^+$), butylammonium ($CH_3CH_2CH_2CH_2NH_3^+$), formamidinium ($NH_2CH=NH_2^+$), hydrazinium, acetylammonium, dimethylammonium, imidazolium, guanidinium, benzylammonium, phenethylammonium, butylammonium and/or any other suitable nitrogen-containing or organic compound. In other examples, an A-cation 210 may include an alkylamine. Thus, an A-cation 210 may include an organic component with one or more amine groups. For example, an A-cation 210 may be an alkyl diamine halide such as formamidinium ($CH(NH_2)_2$). Thus, the A-cation 210 may include an organic constituent in combination with a nitrogen constituent. In some cases, the organic constituent may be an alkyl group such as straight-chain or branched saturated hydrocarbon group having from 1 to 20 carbon atoms. In some embodiments, an alkyl group may have from 1 to 6 carbon atoms. Examples of alkyl groups include methyl($C_1$), ethyl($C_2$), n-propyl ($C_3$), isopropyl ($C_3$), n-butyl ($C_4$), tert-butyl ($C_4$), sec-butyl ($C_4$), iso-butyl ($C_4$), n-pentyl ($C_5$), 3-pentanyl ($C_5$), amyl ($C_5$), neopentyl ($C_5$), 3-methyl-2-butanyl ($C_5$), tertiary amyl ($C_5$), and n-hexyl ($C_6$). Additional examples of alkyl groups include n-heptyl ($C_7$), n-octyl ($C_8$) and the like.

Examples of metal B-cations 220 include, for example, lead, tin, germanium, and or any other 2+ valence state metal that can charge-balance the perovskite 200. Further examples include transition metals in the 2+ state such as Mn, Mg, Zn, Cd, and/or lanthanides such as Eu. B-cations may also include elements in the 3+ valence state, as described below, including for example, Bi, La, and/or Y. Examples for X-anions 230 include halogens: e.g., fluorine, chlorine, bromine, iodine and/or astatine. In some cases, the perovskite halide may include more than one X-anion 230, for example pairs of halogens; chlorine and iodine, bromine and iodine, and/or any other suitable pairing of halogens. In other cases, the perovskite 200 may include two or more halogens of fluorine, chlorine, bromine, iodine, and/or astatine.

Thus, the A-cation 210, the B-cation 220, and X-anion 230 may be selected within the general formula of $ABX_3$ to produce a wide variety of perovskites 200, including, for example, methylammonium lead triiodide ($CH_3NH_3PbI_3$), and mixed halide perovskites such as $CH_3NH_3PbI_{3-x}Cl_x$, and $CH_3NH_3PbI_{3-x}Br_x$. Thus, a perovskite 200 may have more than one halogen element, where the various halogen elements are present in non-integer quantities; e.g., x is not equal to 1, 2, or 3. In addition, perovskite halides, like other organic-inorganic perovskites, can form three-dimensional (3-D), two-dimensional (2-D), one-dimensional (1-D) or zero-dimensional (0-D) networks, possessing the same unit structure. As described herein, the A-cation 210 of a perovskite 200, may include one or more A-cations, for example, one or more of cesium, FA, MA, etc. Similarly, the B-cation 220 of a perovskite 200, may include one or more B-cations, for example, one or more of lead, tin, germanium, etc. Similarly, the X-anion 230 of a perovskite 200 may include one or more anions, for example, one or more halogens (e.g., at least one of I, Br, Cl, and/or F), thiocyanate, and/or sulfur. Any combination is possible provided that the charges balance.

For example, a perovskite having the basic crystal structure illustrated in FIGS. 2A and 2B, in at least one of a cubic, orthorhombic, and/or tetragonal structure, may have other compositions resulting from the combination of the cations having various valence states in addition to the 2+ state and/or 1+ state described above for lead and alkyl ammonium cations; e.g., compositions other than $AB^{2+}X_3$ (where A is one or more cations, or for a mixed perovskite where A is two or more cations). Thus, the methods described herein may be utilized to create novel mixed cation materials having the composition of a double perovskite (elpasolites), $A_2B^{1+}B^{3+}X_6$, with an example of such a composition being $Cs_2BiAgCl_6$ and $Cs_2CuBiI_6$. Another example of a composition covered within the scope of the present disclosure is described by $A_2B^{4+}X_6$, for example $Cs_2PbI_6$ and $Cs_2SnI_6$. Yet another example is described by $A_3B_2^{3+}X_9$, for example $Cs_3Sb_2I_9$. For each of these examples, A is one or more cations, or for a mixed perovskite, A is two or more cations.

Referring again to FIG. 1, in some embodiments of the present disclosure, a device 100 may include a first layer 110 that includes a perovskite positioned adjacent to a second layer 120, i.e., a barrier layer, constructed of a metal oxide. In some embodiments of the present disclosure, a metal oxide barrier layer may be thermally deposited onto the surface 115, e.g., a surface facing the radiation, of the first layer 110. In some embodiments of the present disclosure, a second layer 120 may be constructed of a silicon oxide (i.e., $SiO_x$, where $0 \leq x \leq 2$). Theoretical simulations of proton-perovskite interactions predicted an optimum $SiO_x$ thickness of a second layer 120 of about 1 µm to fully block the most damaging low-energy protons in the energy range of 0.05 MeV (see FIGS. 6B and 7B). $SiO_x$ was found to dramatically improve radiation tolerance, leaving solar cells exposed to 1E15 cm$^{-2}$ fluence of 0.05 MeV protons unharmed. Exposure of solar cells containing $SiO_x$ second layers 120 (i.e., barrier layers) to atomic oxygen during UV-ozone treatment and alpha-particle irradiation resulted in no change in the initial power-conversion-efficiencies (PCEs) (see FIGS. 6C and 6D).

Figure 5:
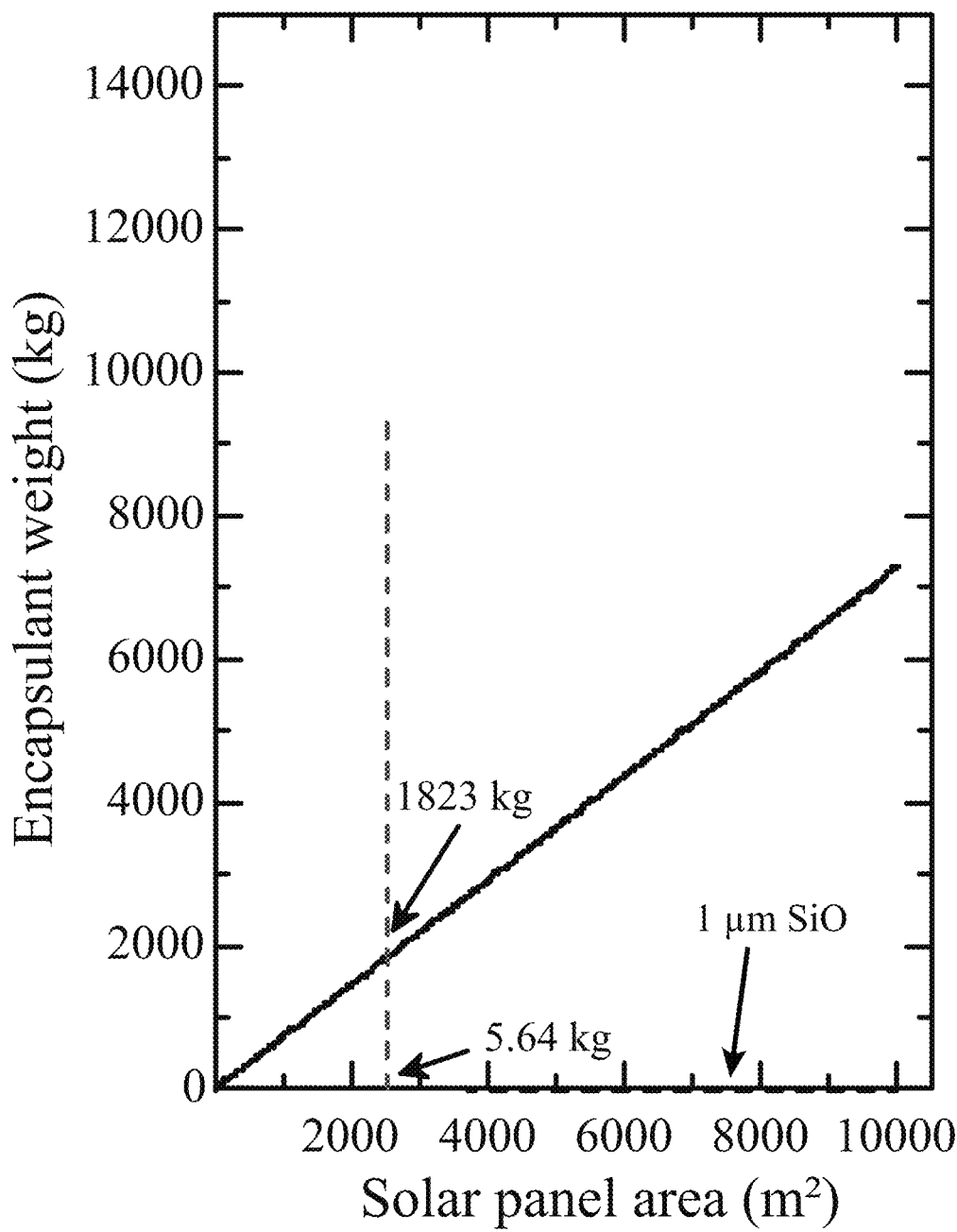
FIG. 5 illustrates a comparison of encapsulant weights as a function of coverage area for a 150 $\mu$m cover glass (solid) and 1 $\mu$m $SiO_x$ (dashed), according to some embodiments of the present disclosure. An area of 2500 m$^2$ corresponds to the solar arrays powering the International Space Station (ISS), indicated by vertical dashed line. The traditional encapsulants also require a space-grade silicone elastomer encapsulant in addition to 150 $\mu$m cover glass, further increasing the overall weight. The 1 $\mu$m $SiO_x$ results in >99% encapsulant weight reduction.

Interestingly, it was found that the $SiO_x$ barrier layer also improves resilience of solar cells to terrestrial stressors: moisture and organic solvents. These $SiO_x$ barrier layers were tested in conjunction with two crucial perovskite absorber chemistries-low bandgap SnPb (were "SnPb" refers to a perovskite having the approximate composition of $Sn_{0.5}Pb_{0.5}$ $(FASnI_3)_{0.6}$ $(MAPbI_3)_{0.4}$, and wider bandgap $CsPbI_2Br$—which are important to tandem PV designs however are highly sensitive to moisture. Surprisingly, J-V measurements of SnPb solar cells were successfully performed in ambient conditions (at a temperature between about 20° C. and about 24° C. and a relative humidity between about 20% and 25%) (see FIG. 12A), while $CsPbI_2Br$ solar cells showed no noticeable loss in PCE even after 100 days of storage in ambient conditions (see FIG. 12C). In fact, the cells survived one minute immersed in DI water (see FIGS. 13A and 13B) and N, N-dimethylformamide (DMF) (two tests performed separately; one in water, one in DMF). The exemplary oxide barrier technology provided a >99% solar array weight reduction compared to the conventional cover glass encapsulants (see FIG. 5) and may provide benefits to both space and terrestrial solar cells utilizing perovskites.

Figure 6A:
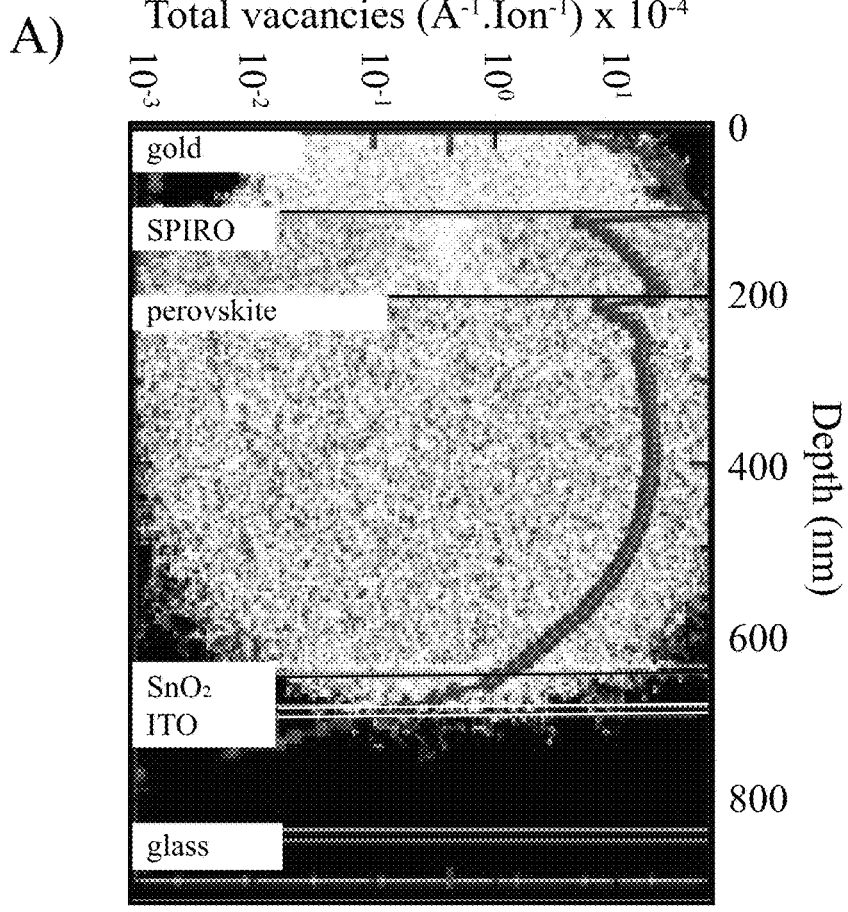
FIG. 6A illustrates a theoretical simulation showing interaction of 0.05 MeV protons for a NIP device without a $SiO_x$ proton barrier layer (Panel A) and an X-ray scanning electron microscopy (X-SEM) image of exemplary device (Panel B), according to some embodiments of the present disclosure.
Figure 6A:
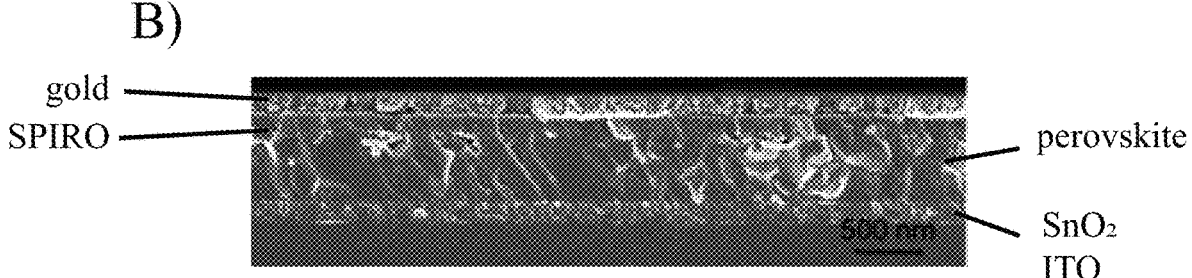
Figure 6B:
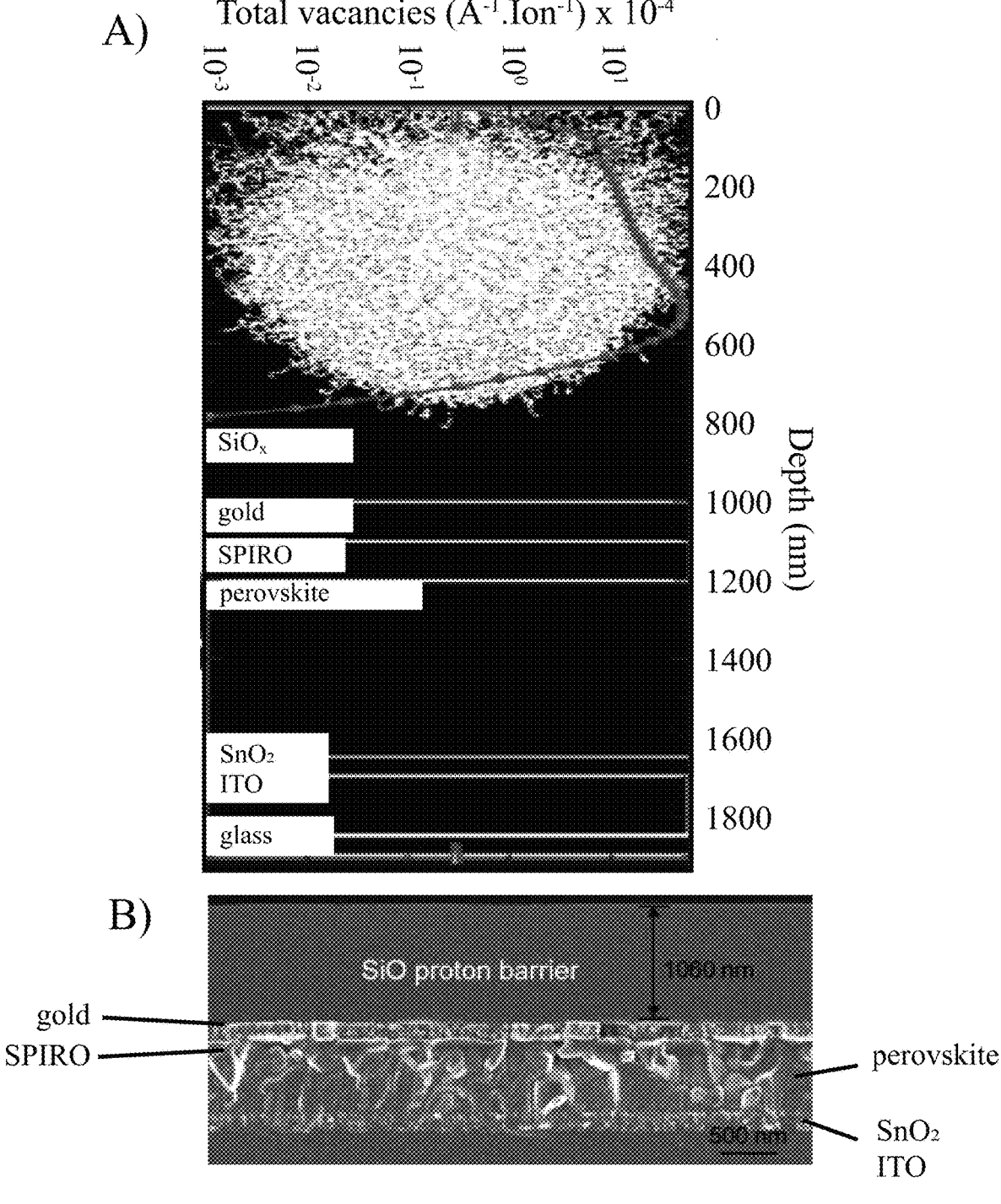
FIG. 6B illustrates a theoretical simulation showing interaction of 0.05 MeV protons for a NIP device with a $SiO_x$ proton barrier layer (Panel A) and an X-SEM image of an exemplary device (Panel B), according to some embodiments of the present disclosure.
Figure 7A:
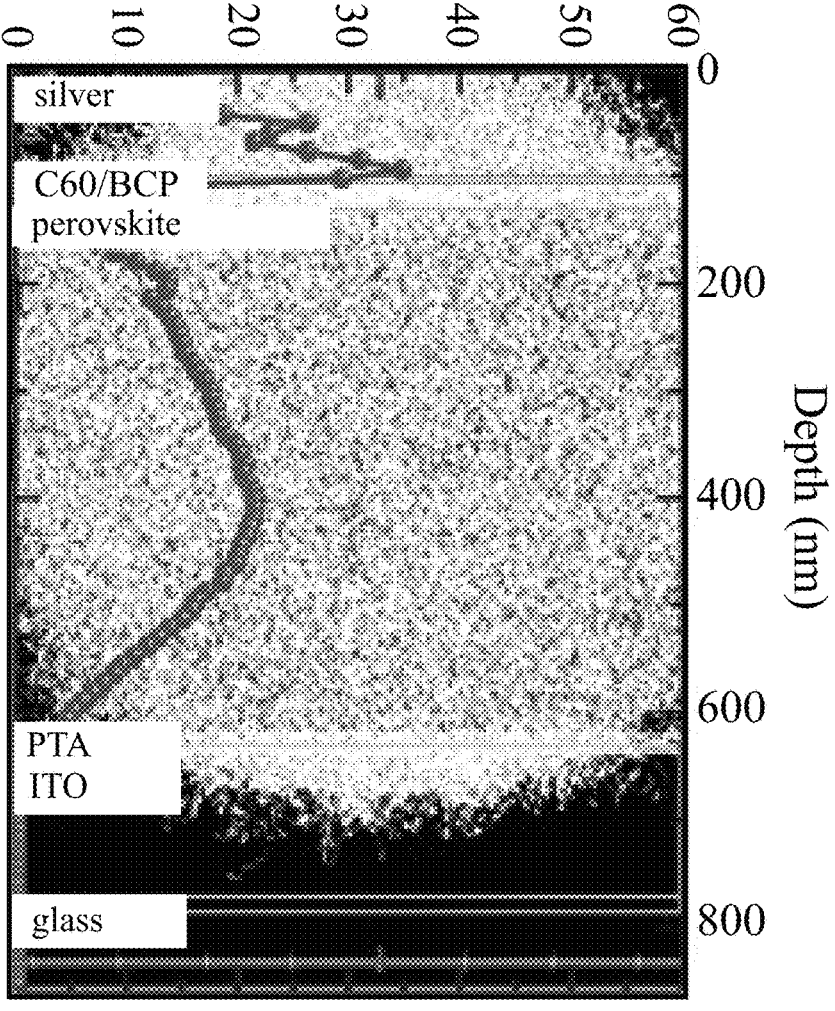
FIG. 7A illustrates a theoretical simulation showing interaction of 0.05 MeV protons for a PIN triple-cation solar cell without a $SiO_x$ barrier (Panel A) and a representation of the PIN device stack (Panel B), according to some embodiments of the present disclosure.
Figure 7A:
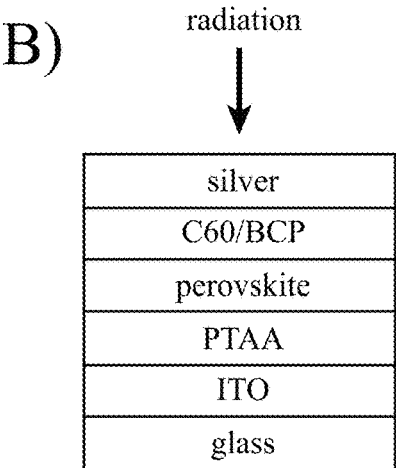
Figure 7B:
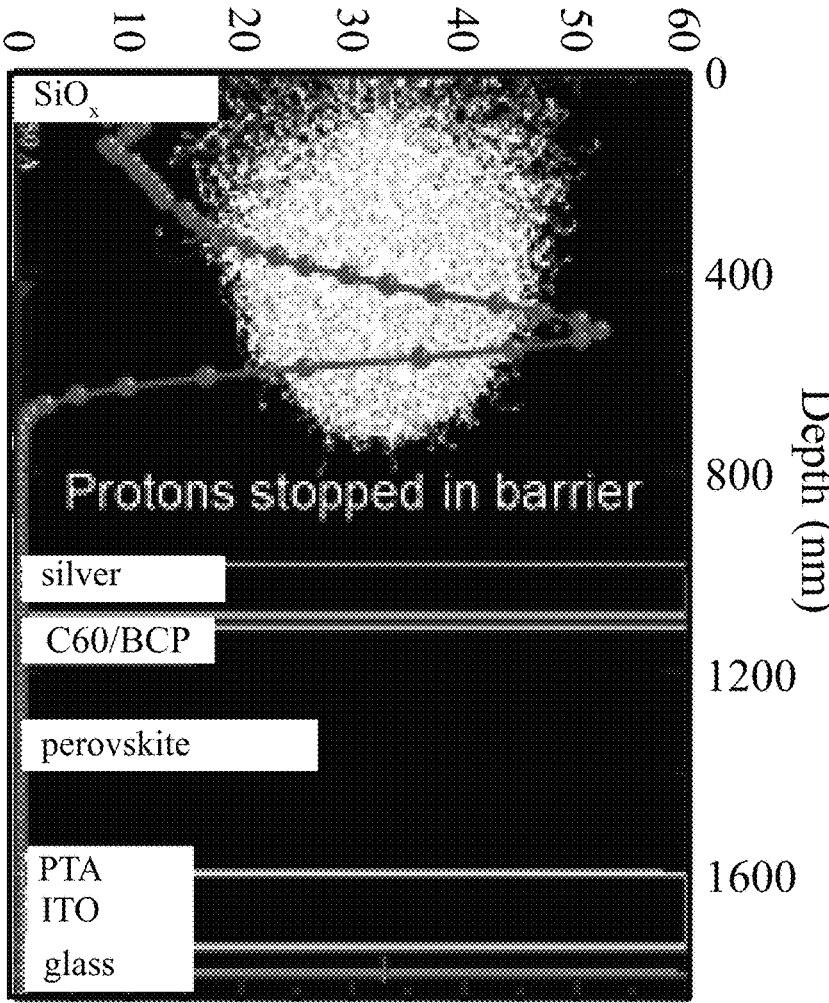
FIG. 7B illustrates a theoretical simulation showing interaction of 0.05 MeV protons for a PIN triple-cation solar cell with a 1 μm thick $SiO_x$ barrier (Panel A) and a representation of the PIN device stack (Panel B), according to some embodiments of the present disclosure.
Figure 7B:
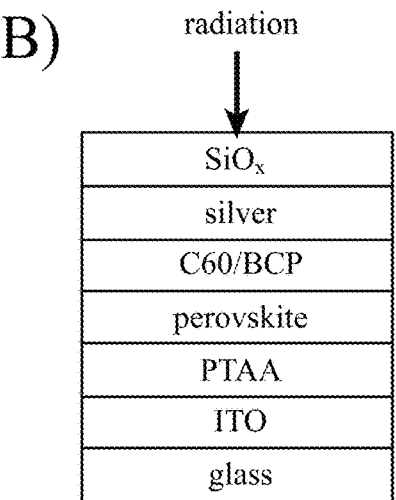

The interaction of 0.05 MeV protons with perovskite solar cells was simulated using the software SRIM/TRIM (Stopping and Range of Ions in Matter/Transport of Ions in Matter), a Monte Carlo simulation that models the passage of ions through matter, considering energy losses via non-ionizing nuclear displacements and electronic ionization. Both NIP and PIN device architectures were modeled comprising of the standard charge transport layers and a perovskite active layer based on $Cs_{0.05}$ $(MA_{0.17}FA_{0.83})_{0.95}Pb(I_{0.83}Br_{0.17})_3$ composition (triple-cation). The proton penetration simulation results for an NIP architecture are shown in FIGS. 6A and 6B without and with a 1 µm $SiO_x$ top layer, respectively. The total number of vacancies resulting from the proton interaction are also plotted as a function of depth in the device stack. For example, referring to Panel A) of FIG. 6A, the curve indicates that a significant number of protons pass through the gold layer, and the SPIRO layer, to penetrate into the underlying perovskite layer. The simulation indicates that some fraction of the protons penetrated the device to the level of the ITO layer and only the underlying glass layer is free from proton radiation. Contrary to this, referring now to Panel A) of FIG. 6B, the simulation for the device capped with an $SiO_x$ barrier layer predicts that 100% of the protons may be blocked by the $SiO_x$ barrier layer. Thus, while protons stop and create vacancies within the perovskite absorber for the bare solar cell, the $SiO_x$ layer fully blocks them in the $SiO_x$-capped device without damage to the device stack. Similar modeling results were obtained for PIN triple-cation solar cells, as shown in FIGS. 7A and 7B, without and with an $SiO_x$ barrier, respectively.

Encouraged by these theoretical insights, a 1 µm thick layer of $SiO_x$ was deposited on NIP and PIN solar cells, having triple cation (cesium, methylammonium (MA), and formamidinium (FA)) perovskite active layers, via thermal evaporation. The resultant devices were first tested to determine whether the $SiO_x$ layer resulted in any degradation in device performance. This was not the case, as evidenced from essentially unchanged PCEs (see FIG. 8C), and relatively identical J-V cures (see FIGS. 8A and 8B, for NIP and PIN devices respectively). Again, these data were collected without exposing the devices to radiation. The performance metrics from the J-V curves illustrated in FIGS. 8A and 8B are summarized in Tables 1 and 2 below, respectively.

TABLE 1

Figure 8A:
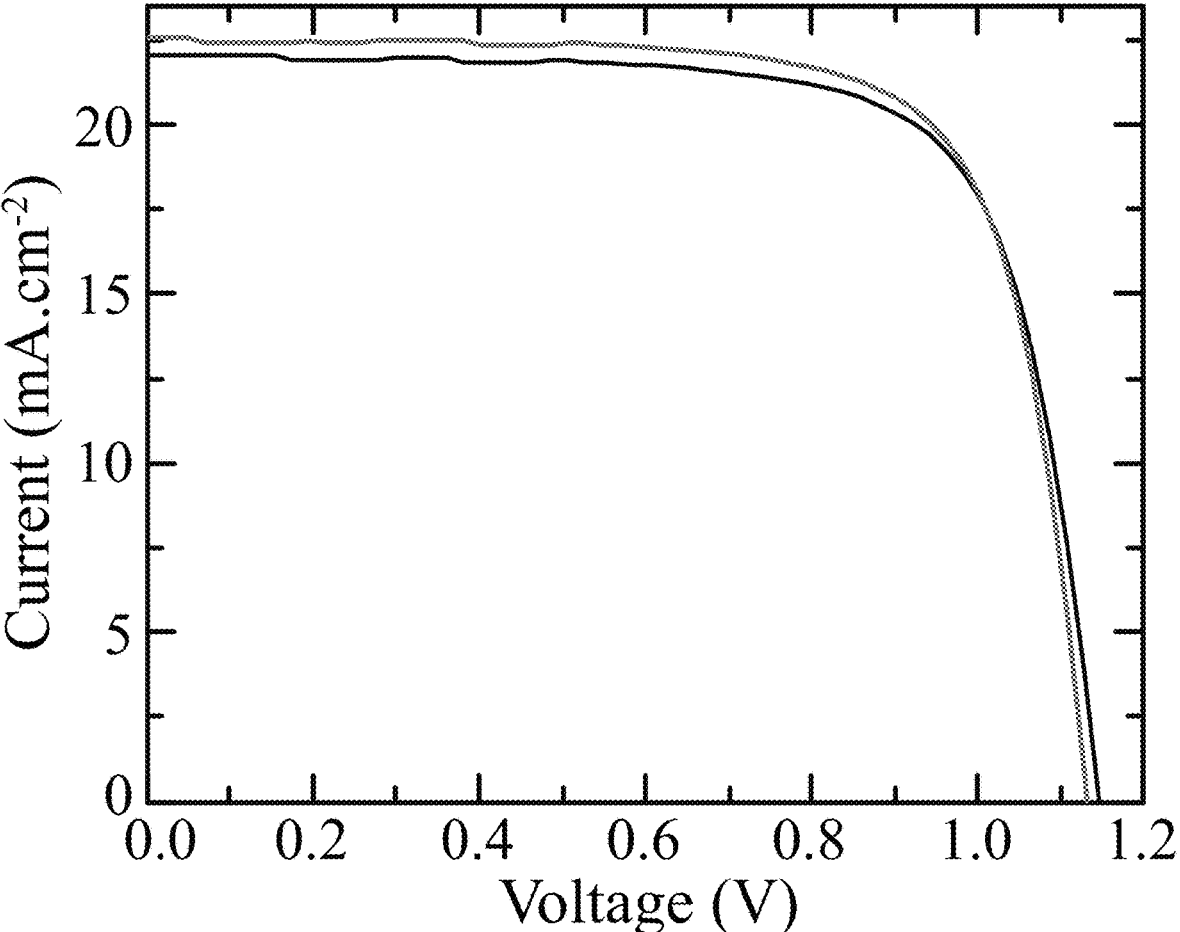
FIG. 8A illustrates J-V curves for bare and protected triple-cation solar cells in a NIP configuration, according to some embodiments of the present disclosure. Dark lines=no $SiO_x$ proton barrier; light line=with an $SiO_x$ proton barrier.
Figure 8B:
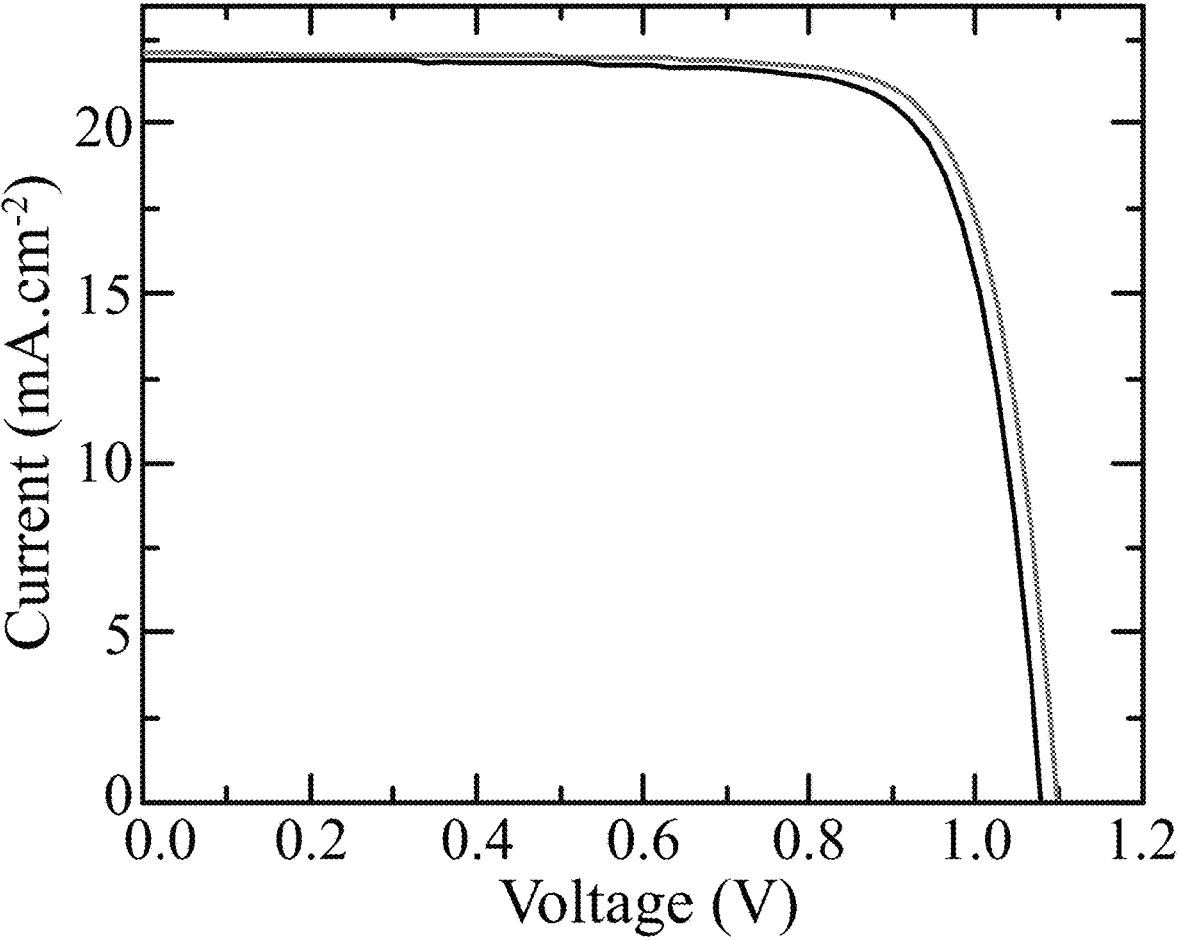
FIG. 8B illustrates J-V curves for bare and protected triple-cation solar cells in a PIN configuration, according to some embodiments of the present disclosure. Dark lines=no $SiO_x$ proton barrier; light line=with an $SiO_x$ proton barrier.
Figure 8C:
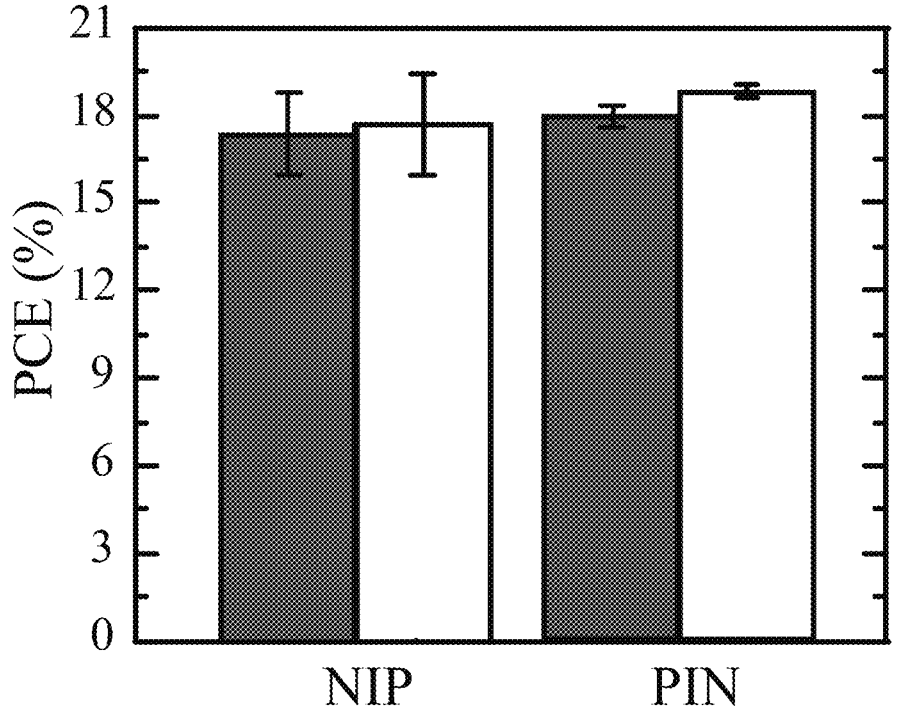
FIG. 8C illustrates bar graphs showing the effect on PCEs after 1 μm $SiO_x$ deposition based on 5 devices per device type (NIP and PIN devices), according to some embodiments of the present disclosure. These data correspond to devices that have not been irradiated. Filled bar=no SiO proton barrier; Empty bar=with an $SiO_x$ proton barrier.

| FIG. 8A performance data summary. Triple cation NIP device. | | |
|---|---|---|
| Metric | No $SiO_x$ layer | With an $SiO_x$ layer |
| $V_{oc}$ | 1.15 | 1.13 |
| $J_{sc}$ | 22.02 | 22.54 |
| FF | 0.73 | 0.74 |
| PCE | 18.56 | 18.91 |

TABLE 2

| FIG. 8A performance data summary. Triple cation PIN device. | | |
|---|---|---|
| Metric | No $SiO_x$ layer | With an $SiO_x$ layer |
| $V_{oc}$ | 1.08 | 1.10 |
| $J_{sc}$ | 21.86 | 22.05 |
| FF | 0.78 | 0.79 |
| PCE | 18.54 | 19.12 |

Figure 6C:
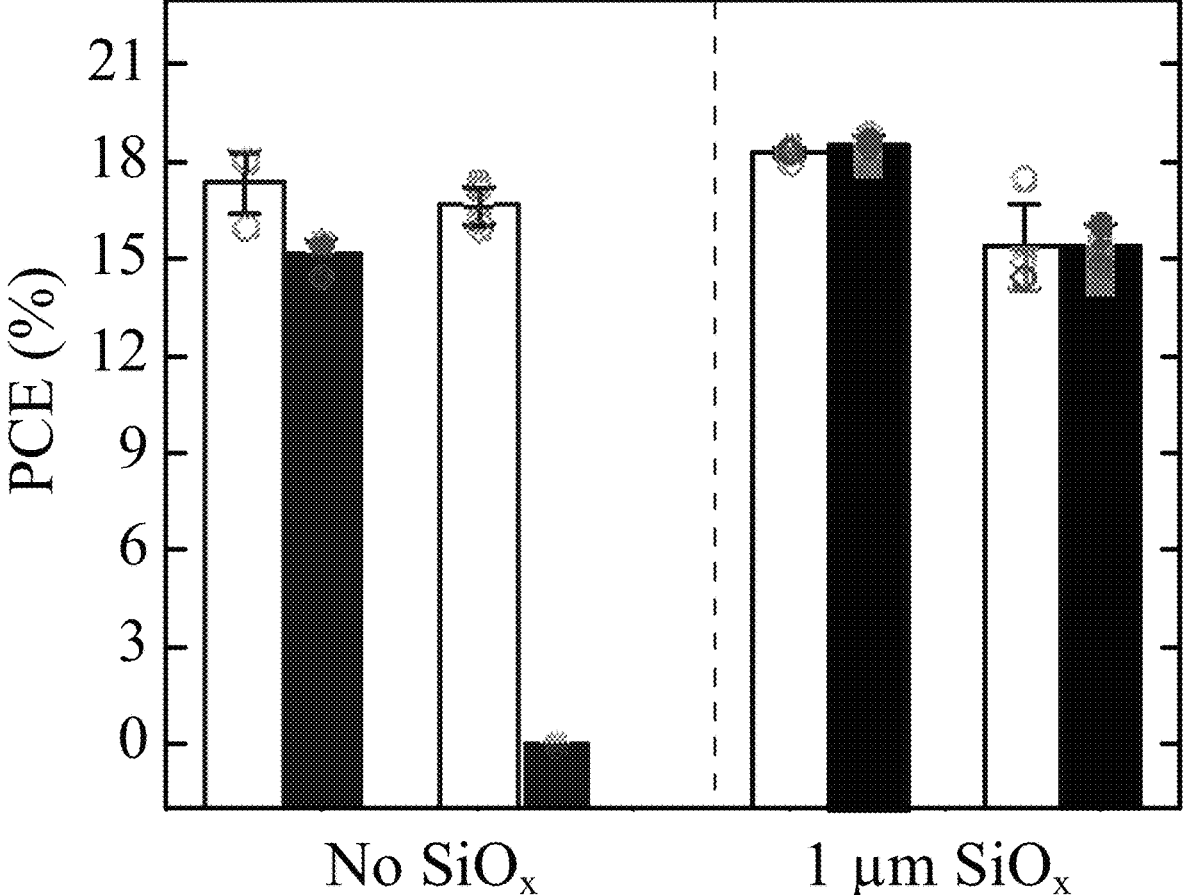
FIG. 6C illustrates averaged PCEs for a NIP device, before (empty bars) and after irradiation (solid bars) with 0.05 MeV protons at fluences of 1E13 $cm^{-2}$ (left data set) and 1E15 $cm^{-2}$ (right data set), without and with an $SiO_x$ proton barrier, according to some embodiments of the present disclosure.
Figure 6D:
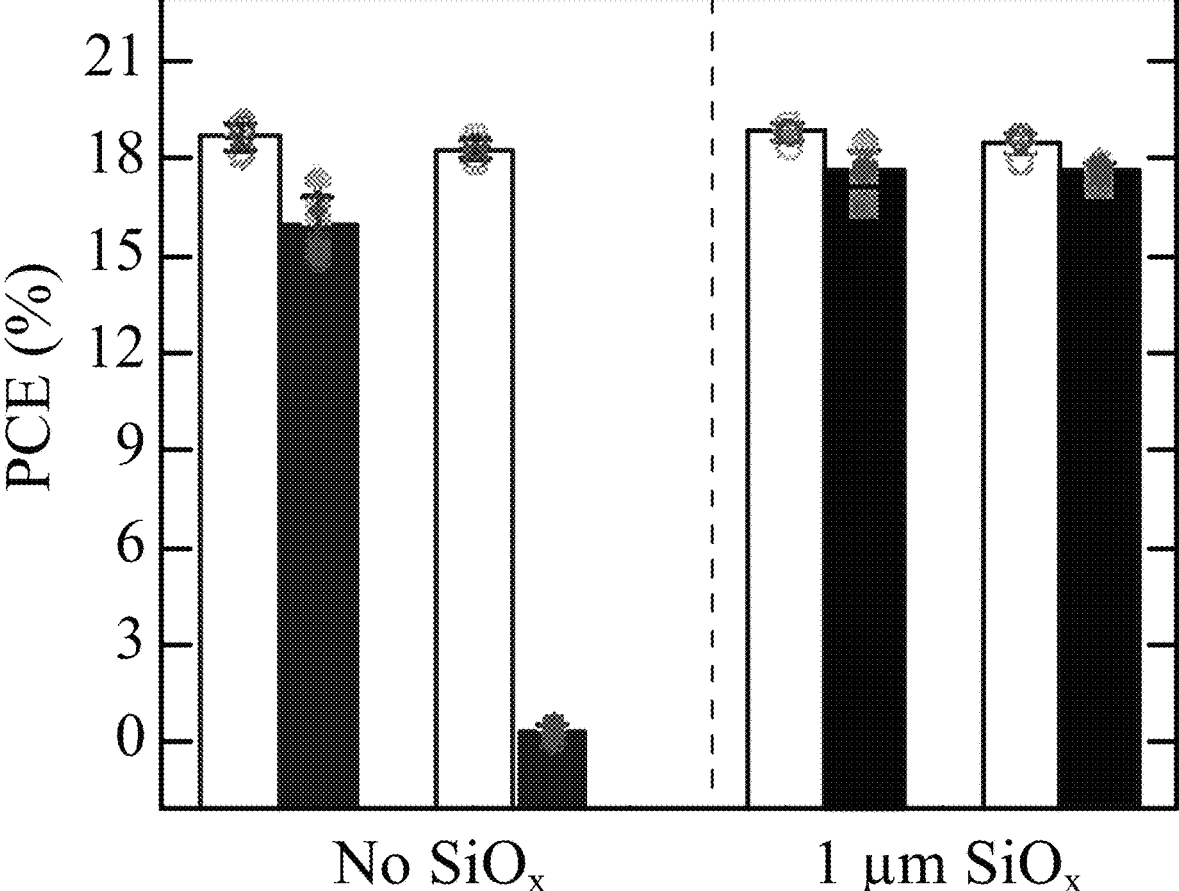
FIG. 6D illustrates and averaged PCEs for a PIN device, before (empty bars) and after irradiation (solid bars) with 0.05 MeV protons at fluences of 1E13 $cm^{-2}$ (left data set) and 1E15 $cm^{-2}$ (right data set), without and with $SiO_x$ proton barrier, according to some embodiments of the present disclosure.
Figure 6E:
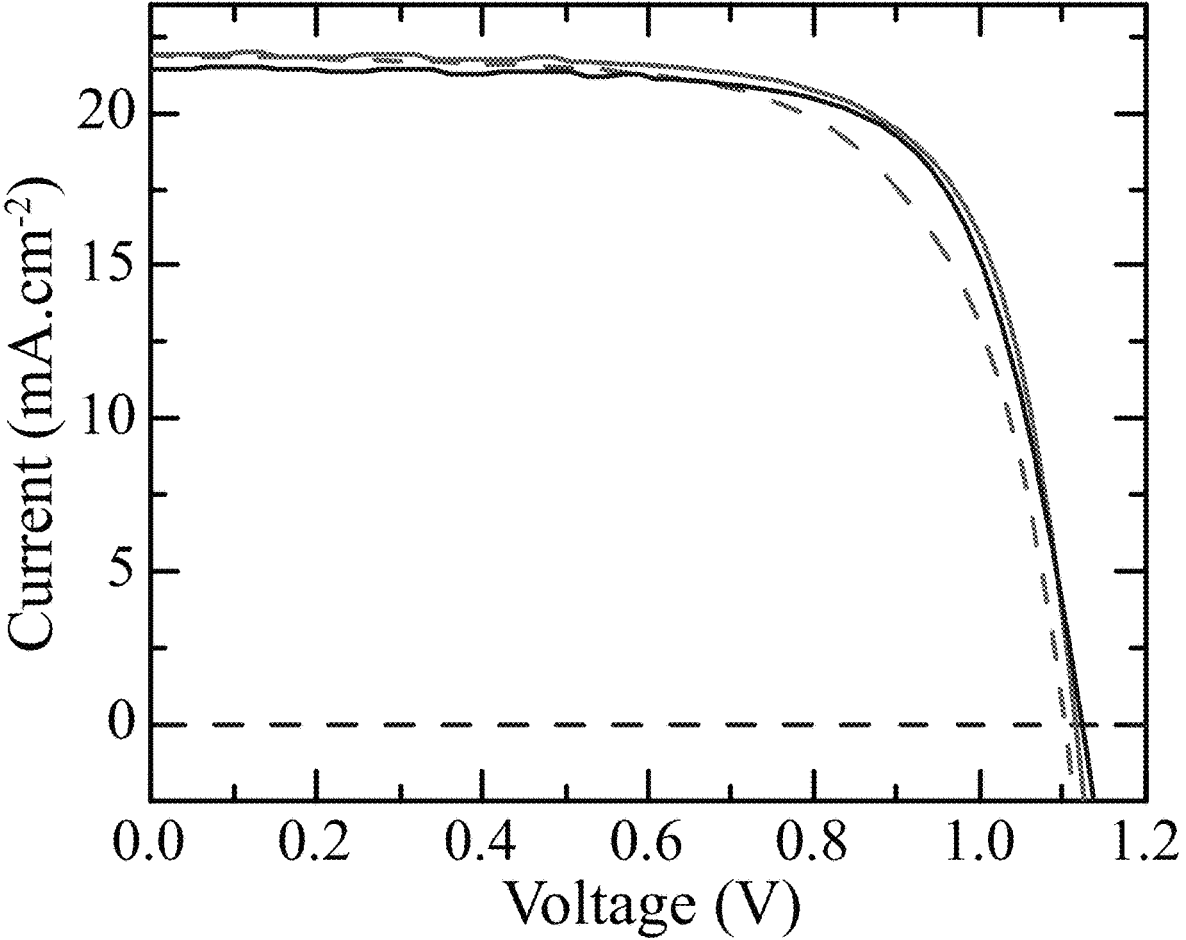
FIG. 6E illustrates the J-V curves corresponding to FIG. 7C (for NIP device), fluence of 1E13 $cm^{-2}$, according to some embodiments of the present disclosure. Dark lines=no $SiO_x$ proton barrier; light line=with an $SiO_x$ proton barrier; solid lines=before irradiation; dashed lines=after irradiation.
Figure 6F:
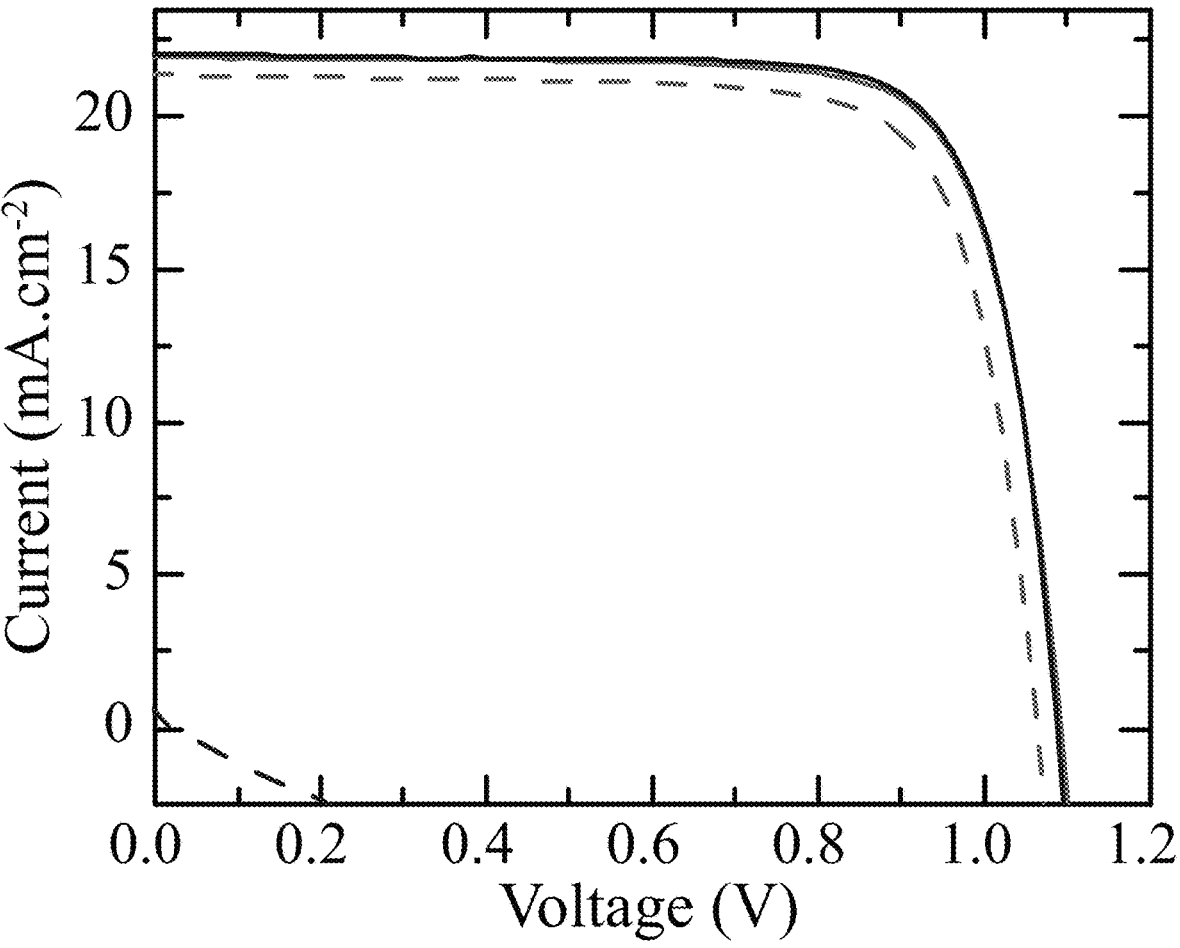
FIG. 6F illustrates the J-V curves corresponding to FIG. 7D (for PIN device), fluence of 1E13 $cm^{-2}$, according to some embodiments of the present disclosure. Dark lines=no $SiO_x$ proton barrier; light line=with an $SiO_x$ proton barrier; solid lines=before irradiation; dashed lines=after irradiation.

Next the devices, both with and without a $SiO_x$ barrier layer were tested before and after irradiation with protons. For these studies, proton fluences of 1E13 cm-2 and 1E15 cm$^{-2}$ were chosen, with the latter equivalent to the radiation exposure resulting from about 10,000 years in the LEO at an altitude approximately equal to that of International Space Station. The effect of proton-irradiation on the power-conversion-efficiencies (PCEs) of the perovskite-containing solar cells is shown in FIGS. 6C and 6D, for NIP and PIN devices, respectively, and representative J-V curves are shown in FIGS. 6E and 6F, for NIP and PIN devices, respectively. Solar cells lacking a barrier layer ("unprotected cells") lost ~15% of their initial PCEs when irradiated with $1E13$ $cm^{-2}$ fluence, while $1E15$ $cm^{-2}$ protons destroyed these devices. The "protected" cells demonstrated a remarkable resilience to these fluences, in line with theoretical insights obtained from the SRIM/TRIM simulations. All of the 'protected' cells maintained essentially the same PCE performance metrics after receiving radiation.

Device parameters from these experiments are summarized in Table 3. The PCE loss observed for the 'bare' solar cells at $1E13$ $cm^{-2}$ fluence is caused by a loss in all the three parameters: $V_{OC}$, $J_{SC}$ and FF. Nonetheless, a final after-radiation PCE of about 85% of its original value, at such a high fluence, is remarkable. Such fluences are known to destroy conventional PV panels.

Figure 11A:
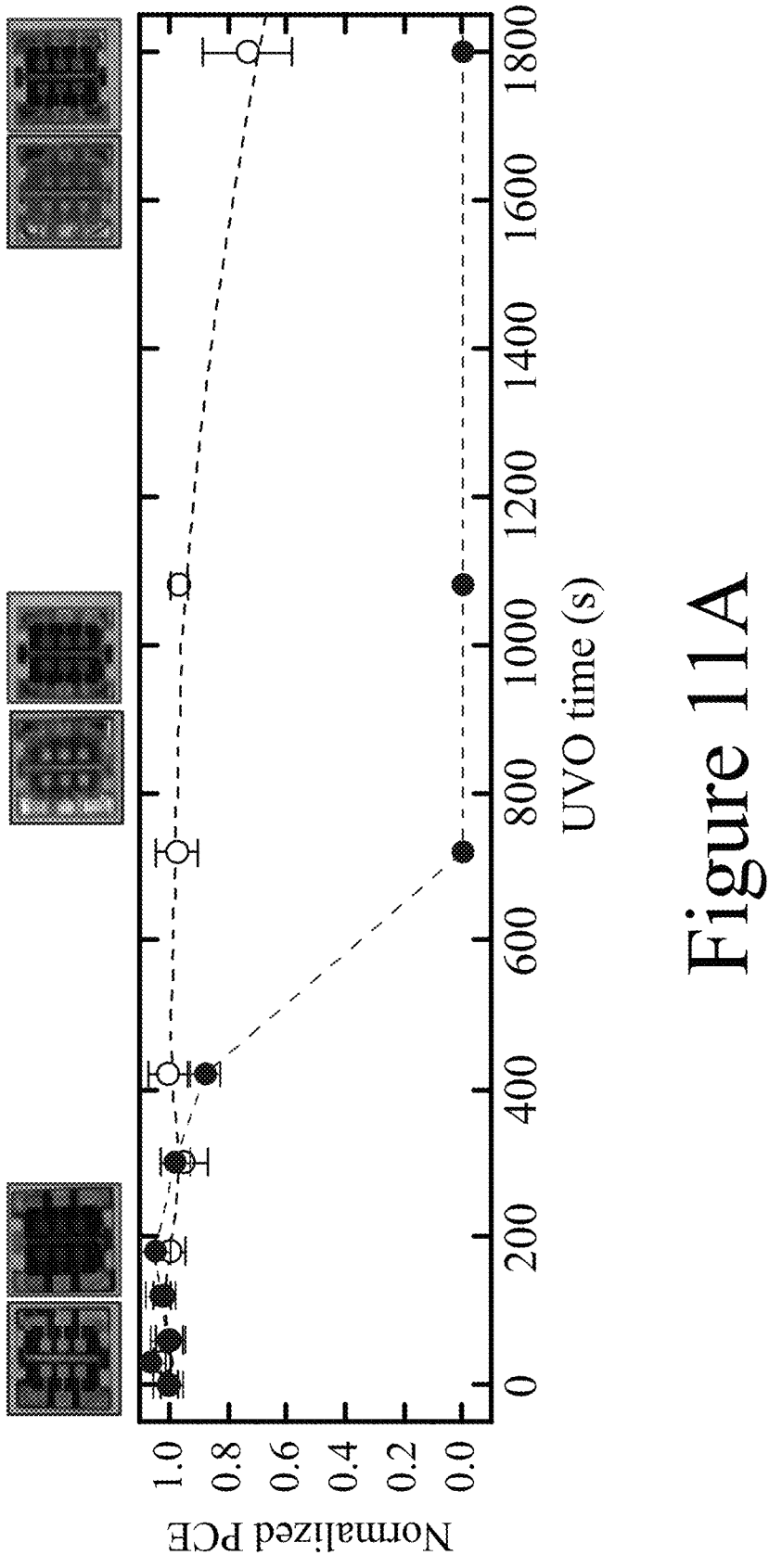
FIG. 11A illustrates $SiO_x$ as atomic oxygen barrier on PIN solar cells without (filled) and with (empty) $SiO_x$ exposed to atomic oxygen via UV-ozone treatment, according to some embodiments of the present disclosure.
Figure 11B:
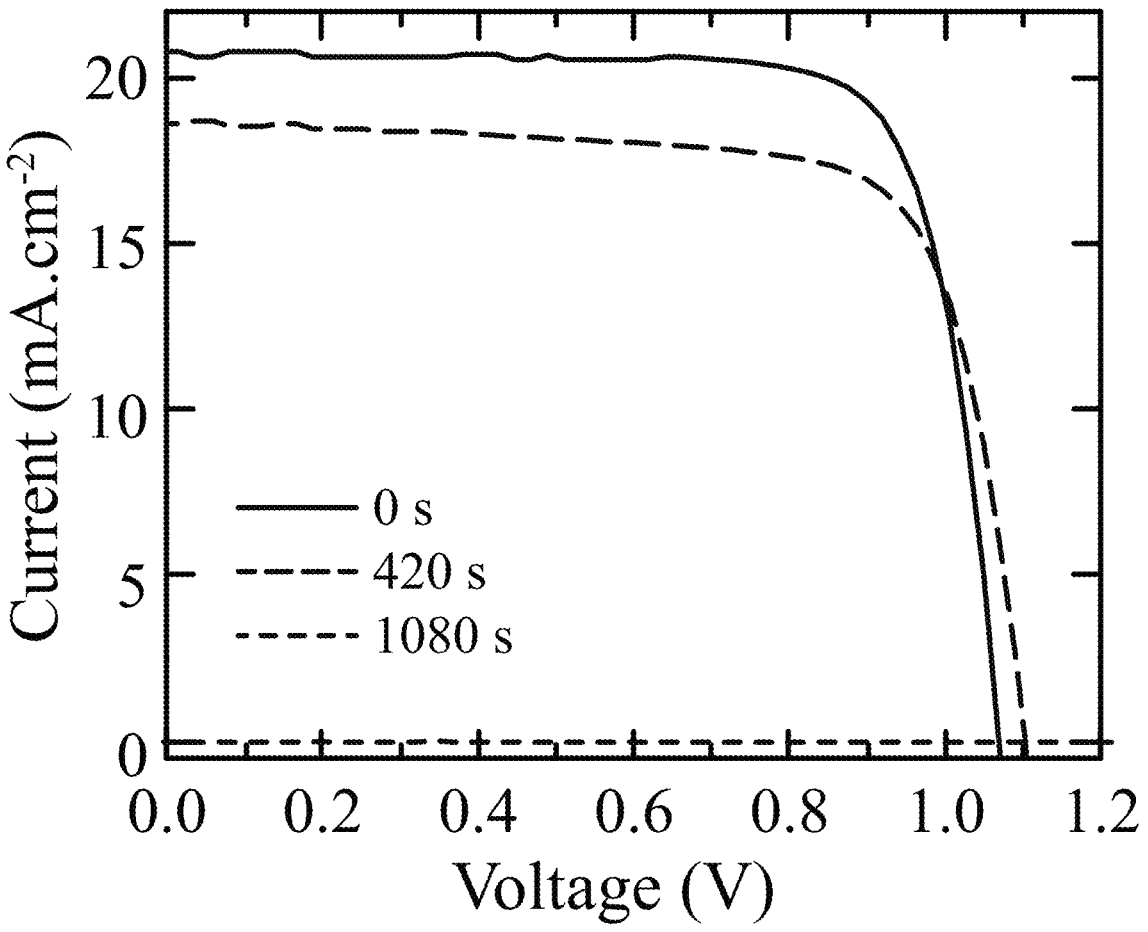
FIGS. 11B and 11C illustrate the J-V curves corresponding to without an $SiO_x$ barrier and with an $SiO_x$ barrier, respectively, for the same devices described in FIG. 11A, according to some embodiments of the present disclosure.
Figure 11C:
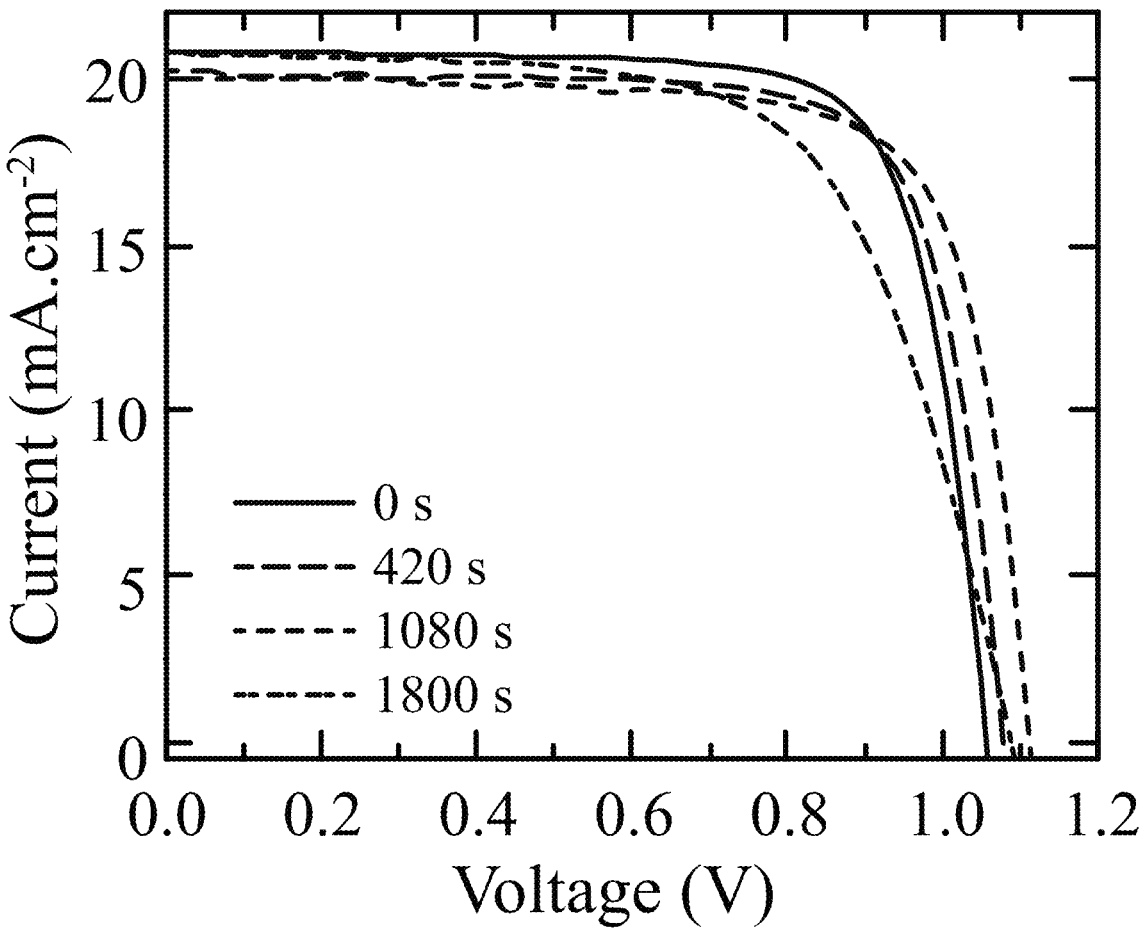
Figure 11D:
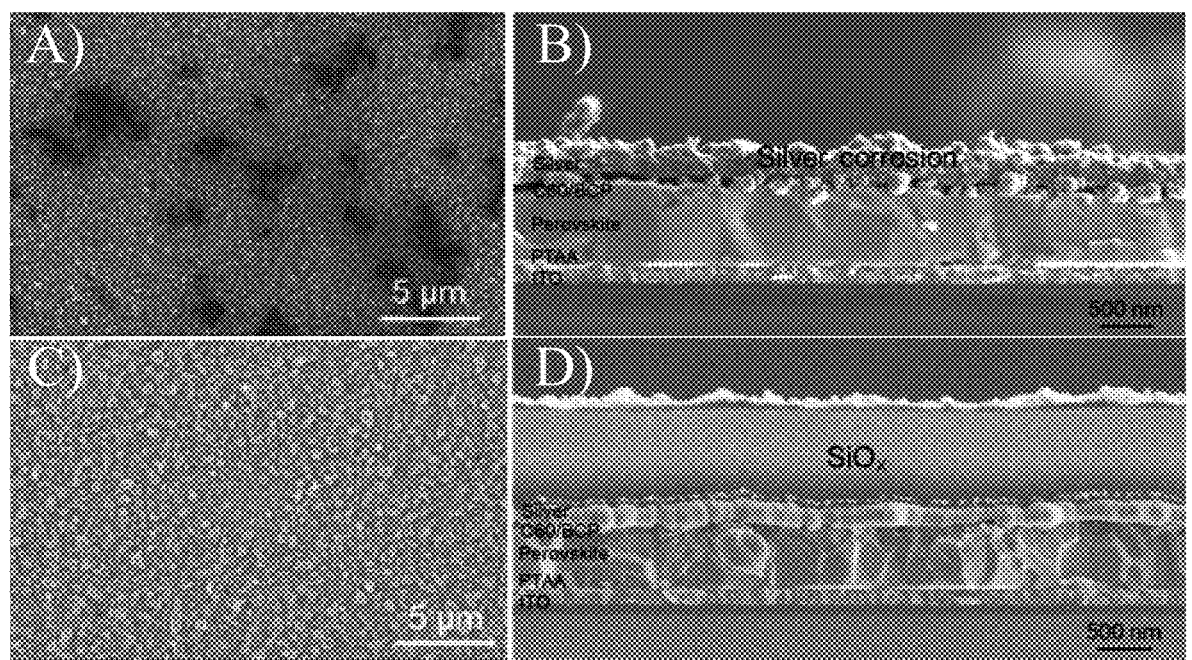
FIG. 11D illustrates photographs of the devices illustrated in FIG. 11A, at exposure times of 0 s, 400 s, and 1200 s are shown at the top, according to some embodiments of the present disclosure. Top-view and X-SEM images for UV-ozone treated devices without a $SiO_x$ barrier layer (Panels A) and B)) and with a $SiO_x$ barrier layer (Panels C) and D)).

PCE of PIN triple-cation solar cells with and without $SiO_x$ barrier (empty circles and filled circles, respectively). The bare, unprotected device experienced complete damage after only about 8 minutes of UV-ozone exposure, while the protected device retained its initial PCE even after about 20 minutes of exposure. Discoloration (as indicated by changes in grayscale) of the bare device is visible in the photographs shown in FIG. 11A. Atomic oxygen corroded the silver electrodes, as determined by SEM. Panels A and C of FIG. 11D show top-view SEM images of the metal electrode areas of the bare and protected cells, respectively. The bare, unprotected (i.e., no $SiO_x$ barrier) cell (see Panel A of FIG. 11D) shows damage, which becomes obvious when the cross-section of this device was imaged see (see B of FIG. 11D). No noticeable changes were found in the protected

TABLE 3

Summary of device parameters and PCE remaining factors for NIP and PIN solar cells irradiated with 0.05 MeV protons at fluences of $1E13$ $cm^{-2}$ and $1E15$ $cm^{-2}$ with and without $SiO_x$ proton barrier.

| Architecture | Proton Fluence (cm$^{-2}$) | | $V_{OC}$ (V) | $J_{SC}$ (mA·cm$^{-2}$) | FF | PCE (%) | Remaining factor (PCE$_{after}$/PCE$_{before}$) |
|---|---|---|---|---|---|---|---|
| NIP_without SiO$_x$ | 1E13 | Before | 1.12 ± 0.00 | 21.93 ± 0.08 | 0.71 ± 0.03 | 17.35 ± 0.99 | |
| | | After | 1.07 ± 0.00 | 21.67 ± 0.10 | 0.65 ± 0.02 | 15.13 ± 0.46 | 0.87 ± 0.08 |
| | 1E15 | Before | 1.12 ± 0.01 | 21.60 ± 0.10 | 0.69 ± 0.02 | 16.66 ± 0.61 | |
| | | After | 0 | 0 | 0 | 0 | 0.00 |
| NIP_with 1 μm SiO$_x$ | 1E13 | Before | 1.13 ± 0.00 | 22.01 ± 0.16 | 0.74 ± 0.00 | 18.31 ± 0.16 | |
| | | After | 1.12 ± 0.00 | 22.27 ± 0.17 | 0.74 ± 0.01 | 18.53 ± 0.32 | 1.01 ± 0.03 |
| | 1E15 | Before | 1.09 ± 0.01 | 21.38 ± 0.32 | 0.65 ± 0.04 | 15.36 ± 1.29 | |
| | | After | 1.11 ± 0.01 | 21.72 ± 0.11 | 0.64 ± 0.03 | 15.37 ± 0.66 | 1.00 ± 0.13 |
| PIN_without SiO$_x$ | 1E13 | Before | 1.09 ± 0.01 | 21.98 ± 0.17 | 0.78 ± 0.01 | 18.70 ± 0.39 | |
| | | After | 1.05 ± 0.01 | 20.18 ± 0.45 | 0.75 ± 0.01 | 15.95 ± 0.87 | 0.85 ± 0.06 |
| | 1E15 | Before | 1.09 ± 0.00 | 22.01 ± 0.07 | 0.76 ± 0.01 | 18.30 ± 0.28 | |
| | | After | 0.42 ± 0.27 | 3.00 ± 1.86 | 0.18 ± 0.02 | 0.33 ± 0.25 | 0.02 ± 0.01 |
| PIN_with 1 μm SiO$_x$ | 1E13 | Before | 1.09 ± 0.00 | 21.92 ± 0.10 | 0.78 ± 0.00 | 18.82 ± 0.25 | |
| | | After | 1.08 ± 0.01 | 21.35 ± 0.17 | 0.76 ± 0.02 | 17.65 ± 0.64 | 0.94 ± 0.05 |
| | 1E15 | Before | 1.09 ± 0.00 | 21.84 ± 0.19 | 0.77 ± 0.00 | 18.49 ± 0.29 | |
| | | After | 1.07 ± 0.01 | 21.29 ± 0.07 | 0.77 ± 0.00 | 17.61 ± 0.26 | 0.95 ± 0.03 |

Figure 9:
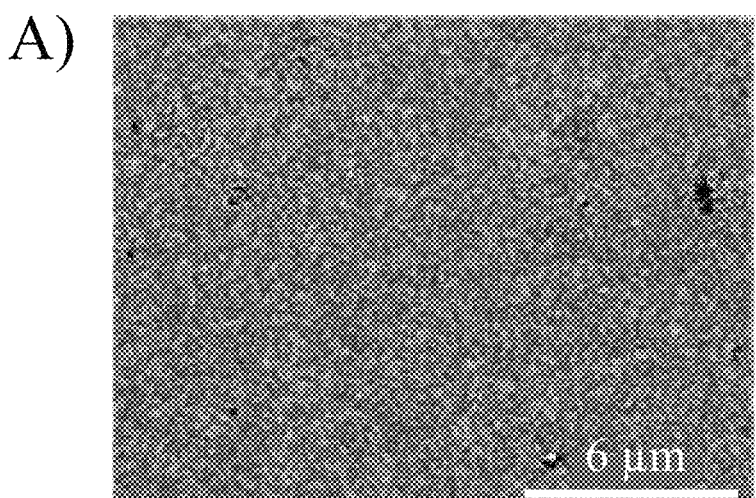
FIG. 9 illustrates SEM images of PIN triple-cation solar cells Panel A) without, and Panel B) with $SiO_x$ barrier, irradiated with 0.05 MeV protons at a fluence of 1E15 $cm^{-2}$, according to some embodiments of the present disclosure. Several small pinholes can be seen on the bare device. This device showed complete damage (0% PCE), while the $SiO_x$-capped device showed no drop from its initial PCE.
Figure 9:
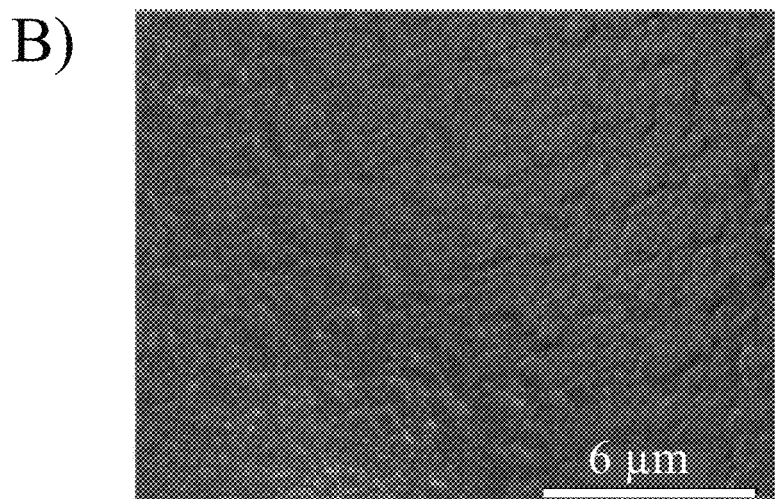
Figure 10:
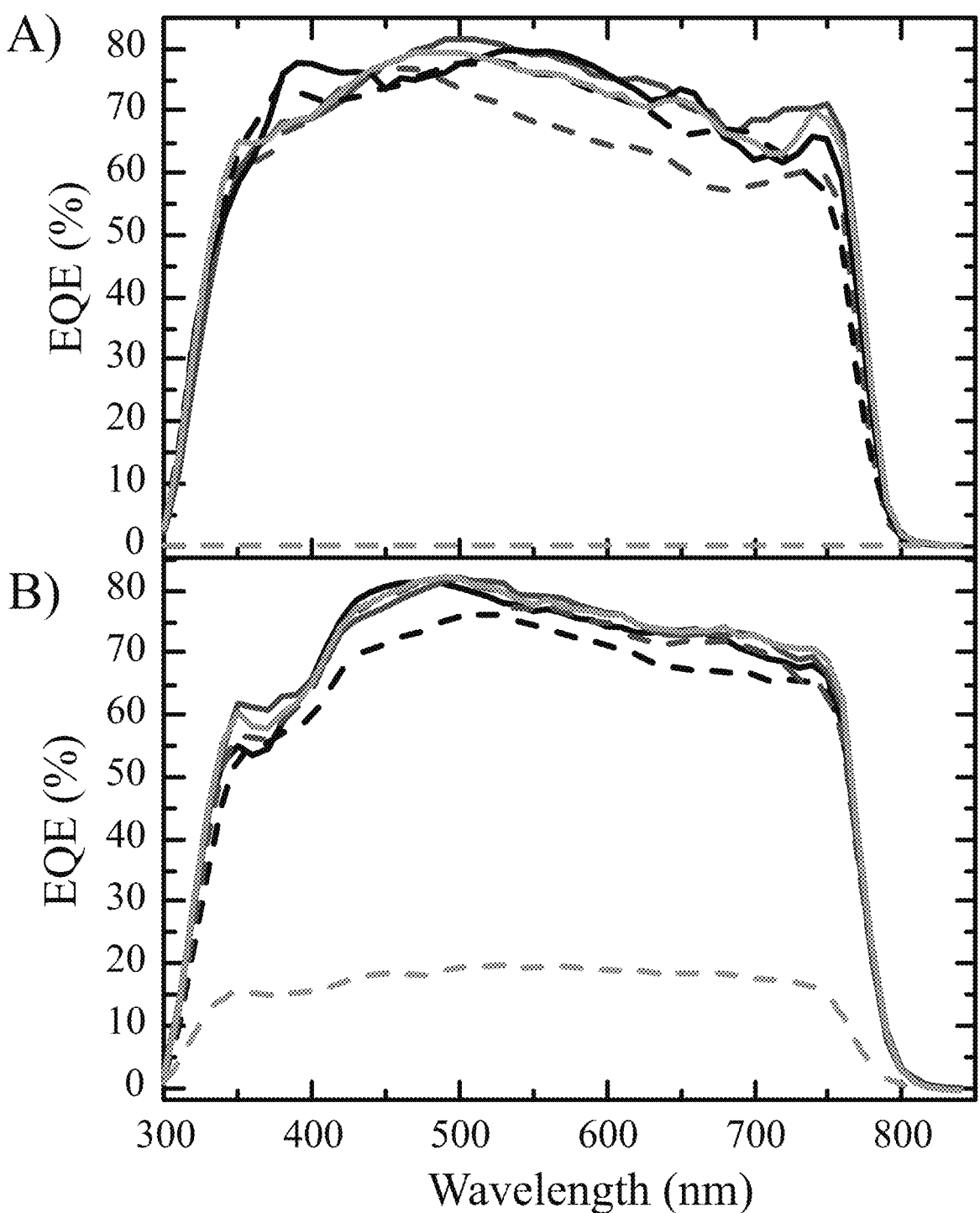
FIG. 10 illustrates EQE data on a Panel A) NIP, and Panel B) PIN triple-cation solar cells irradiation with different fluences of 0.05 MeV protons, according to some embodiments of the present disclosure. Data for devices with $SiO_x$ barriers (dashed lines) and devices with $SiO_x$ barriers (solid lines) are shown. (Black=control; middle gray=1e13; light gray=1e15)

FIG. 9 illustrates scanning electron microscopy (SEM) images for PIN solar cells with (Panel B) and without 1 μm $SiO_x$ barrier (Panel A) irradiated with 0.05 MeV protons at $1E15$ $cm^{-2}$ fluence. Pinholes can be seen in the bare device likely due to damage caused by the high proton fluence. External quantum efficiency (EQE) data is shown in FIG. 10, Panel A for a NIP device, and Panel B for a PIN device, and confirms the $J_{SC}$ trends in Table 3. EQE values for the $1E15$ $cm^{-2}$ irradiated cells are close to 0, as expected. For all other devices, the EQE values remain almost unchanged.

Atomic oxygen and UV-radiation form another major stressor in the space environment. This effect was simulated by carrying out UV-ozone treatment of the solar cells. During operation, a UV-ozone chamber creates atomic oxygen which is responsible for interacting with surface organics and subsequent cleaning. FIG. 11A shows normalized device (see Panels C and D of FIG. 11D). FIGS. 11B and 11C illustrate the J-V curves corresponding to without an $SiO_x$ barrier and with an $SiO_x$ barrier, respectively, for the same devices described in FIG. 11A, according to some embodiments of the present disclosure.

Figure 12A:
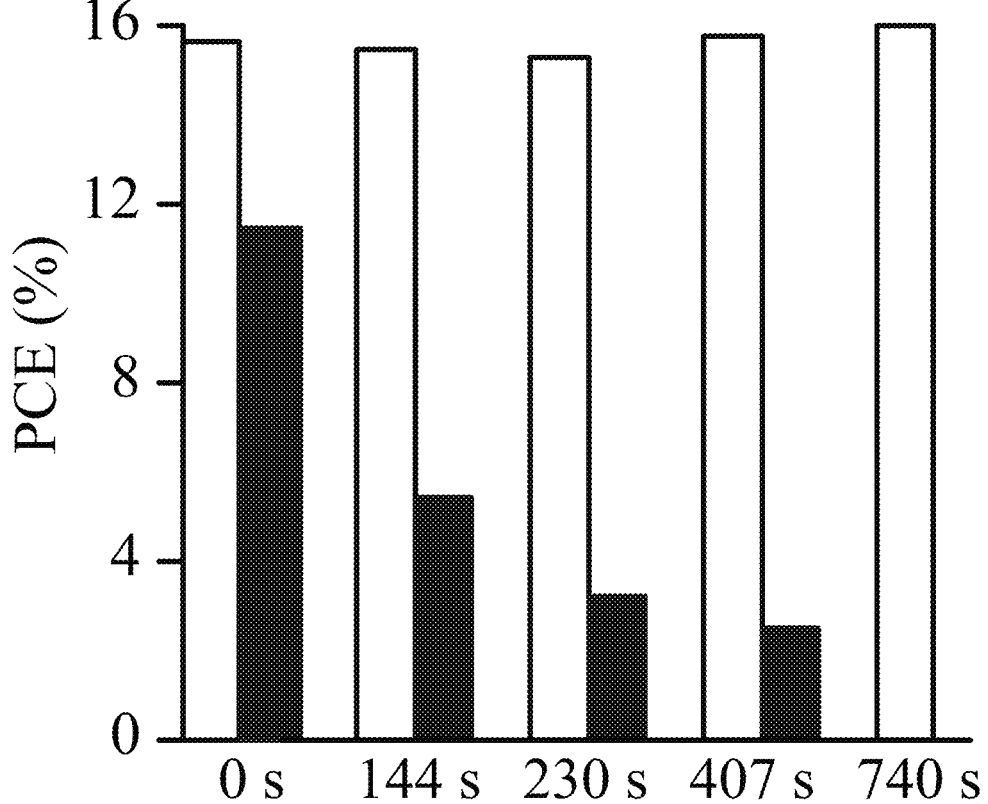
FIG. 12A illustrates bar graphs showing PCE of SnPb devices measured in the ambient without (black bars) and with (empty bars) $SiO_x$ as a moisture barrier for various ambient exposure times, according to some embodiments of the present disclosure.
Figure 12B:
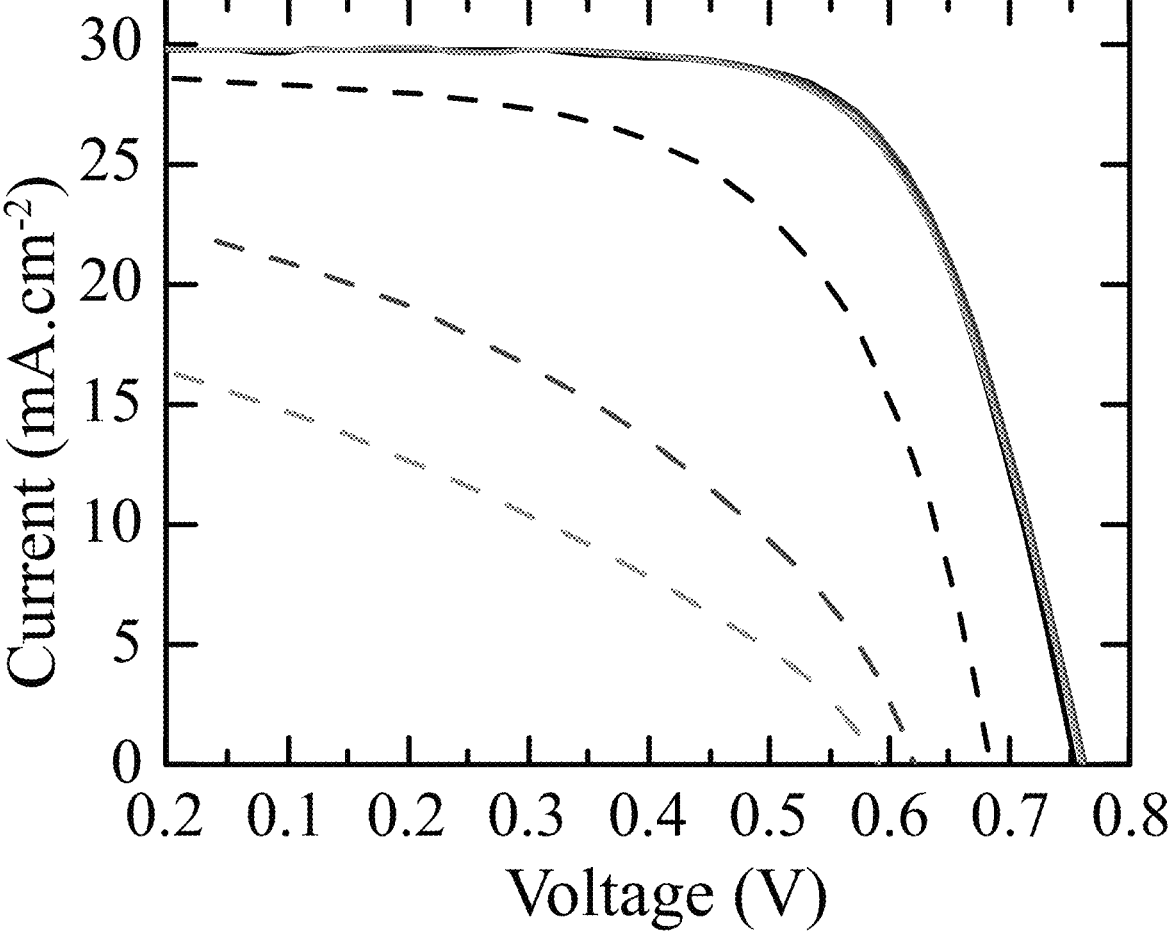
FIG. 12B illustrates the J-V curves corresponding to the devices of FIG. 12A, where dashed curves correspond to the devices without $SiO_x$ and solid curves correspond to the devices with an $SiO_x$ barrier, according to some embodiments of the present disclosure. (Black=0 seconds; middle gray=144 seconds; light gray=230 seconds)
Figure 12C:
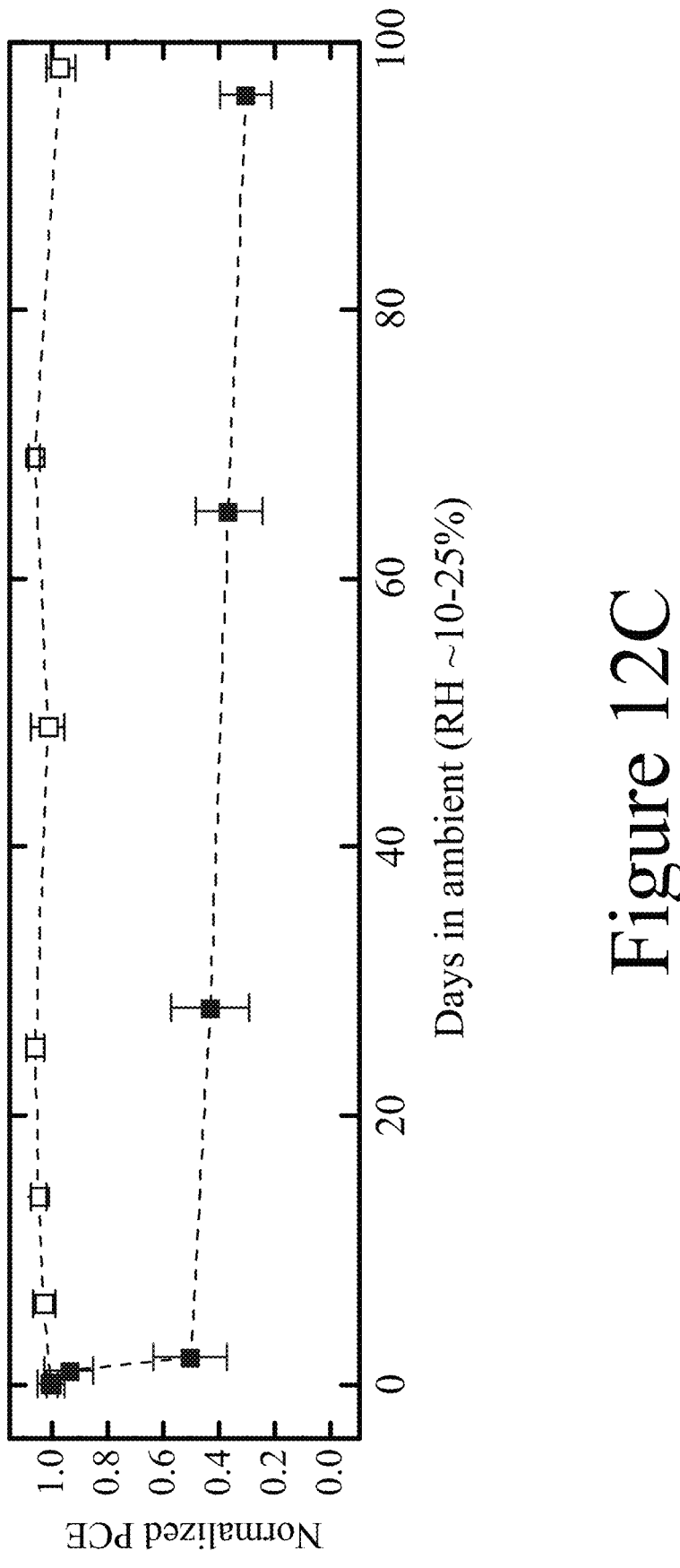
FIG. 12C illustrates shelf-life data for all-inorganic $CsPbI_2Br$ devices stored in ambient, both with (empty squares) and without the use of $SiO_x$ barriers (solid squares), according to some embodiments of the present disclosure.

The remarkable morphological uniformity of the $SiO_x$ barrier layer, as evidenced by SEM, also points toward its potential as a moisture and chemical barrier for terrestrial applications. To illustrate this point, two perovskite absorber chemistries were chosen that are highly sensitive to moisture. Solar cells based on a low bandgap (1.25 eV) SnPb absorber are usually characterized inside a $N_2$ glove box as taking them out and exposing them to ambient air can result in their degradation. Similarly, solar cells based on the wide bandgap (1.88 eV) $CsPbI_2Br$ perovskite absorbers are typically sensitive to moisture. Although, these chemistries are very promising for tandem solar cell designs, their moisture sensitivity needs to be addressed for industrial implementation. FIG. 12A shows PCEs of SnPb solar cells measured in ambient conditions (where "ambient" refers to a temperature between about 20° C. and 24° C. and a relative humidity between about 20% and about 25%). As expected, bare cells without SiO$_x$ immediately degraded (black bars) and lost almost all of their initial PCE within about 4 minutes. FIG. 12B illustrates the J-V curves corresponding to the PCE data of FIG. 12A.

On the other hand, the SiO$_x$-capped cells fully retained their initial PCE, even after about 12 minutes.

Figure 12D:
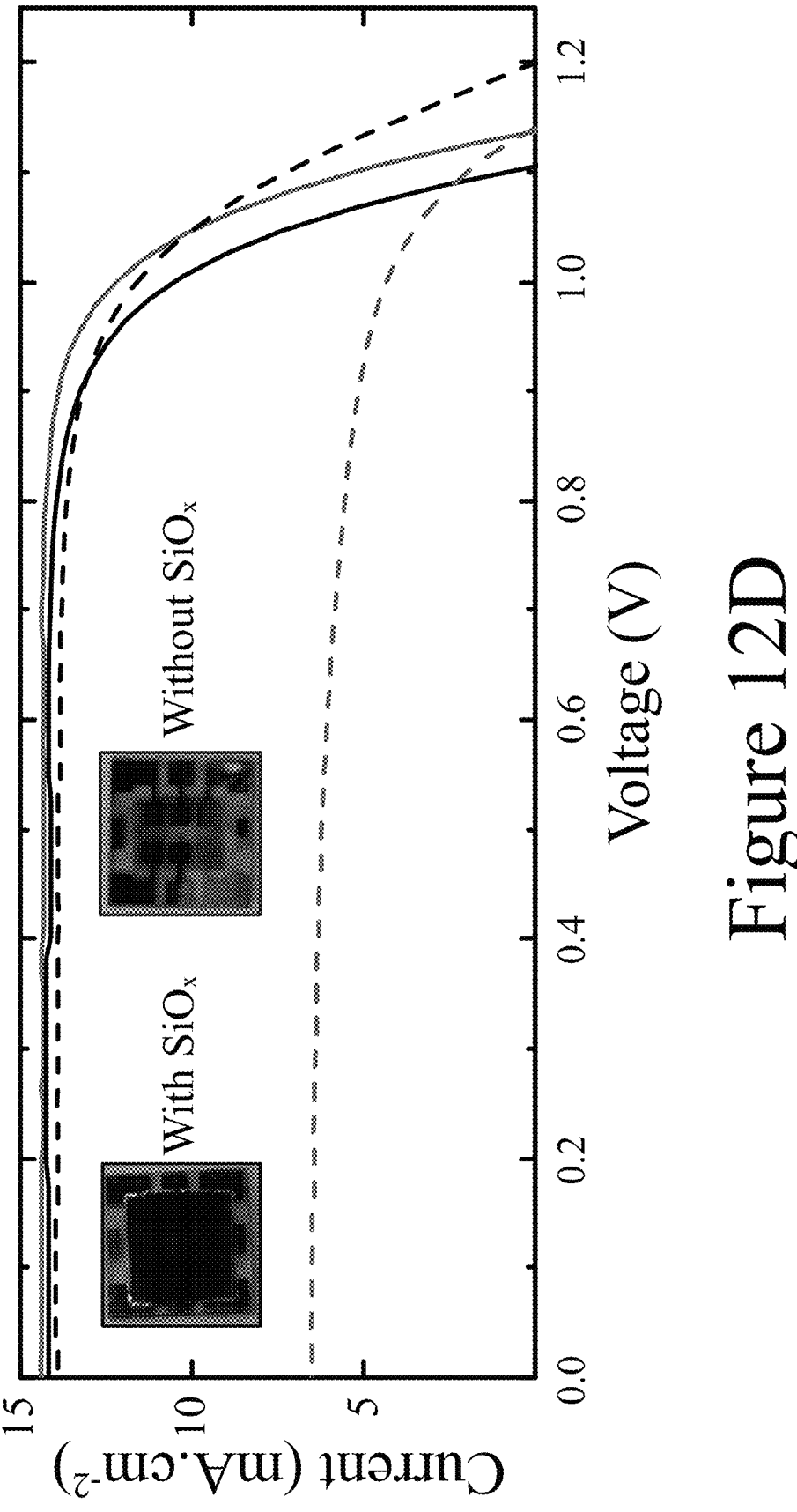
FIG. 12D illustrates the J-V curves corresponding to the shelf-life data of FIG. 12C, at the start of ambient aging (black) and after 1 month (gray), according to some embodiments of the present disclosure. Solid lines=with $SiO_x$ barrier; Dashed lines—without $SiO_x$ barrier.

An SiO$_x$ barrier layer was also found to enhance the ambient shelf-life of CsPbI$_2$Br solar cells (see FIG. 12C) with the protected cell retaining its initial PCE of ~12.0% even after 100 days exposure to ambient conditions. FIG. 12D illustrates the J-V curves corresponding to the shelf-life data of FIG. 12C, at the start of ambient aging (black) and after 1 month (gray), according to some embodiments of the present disclosure. The insets of FIG. 12D show photographs of the devices. The bare cells underwent phase segregation and turned transparent within only a few days of exposure to ambient conditions, whereas the protected cells retained the typical dark, opaque appearance, indicating an intact perovskite structure. These observations confirm that the SiO$_x$ barrier layer can greatly minimize if not completely suppress moisture ingress in perovskite-containing solar cells, thus prolonging their useful lifespan.

Figure 13A:
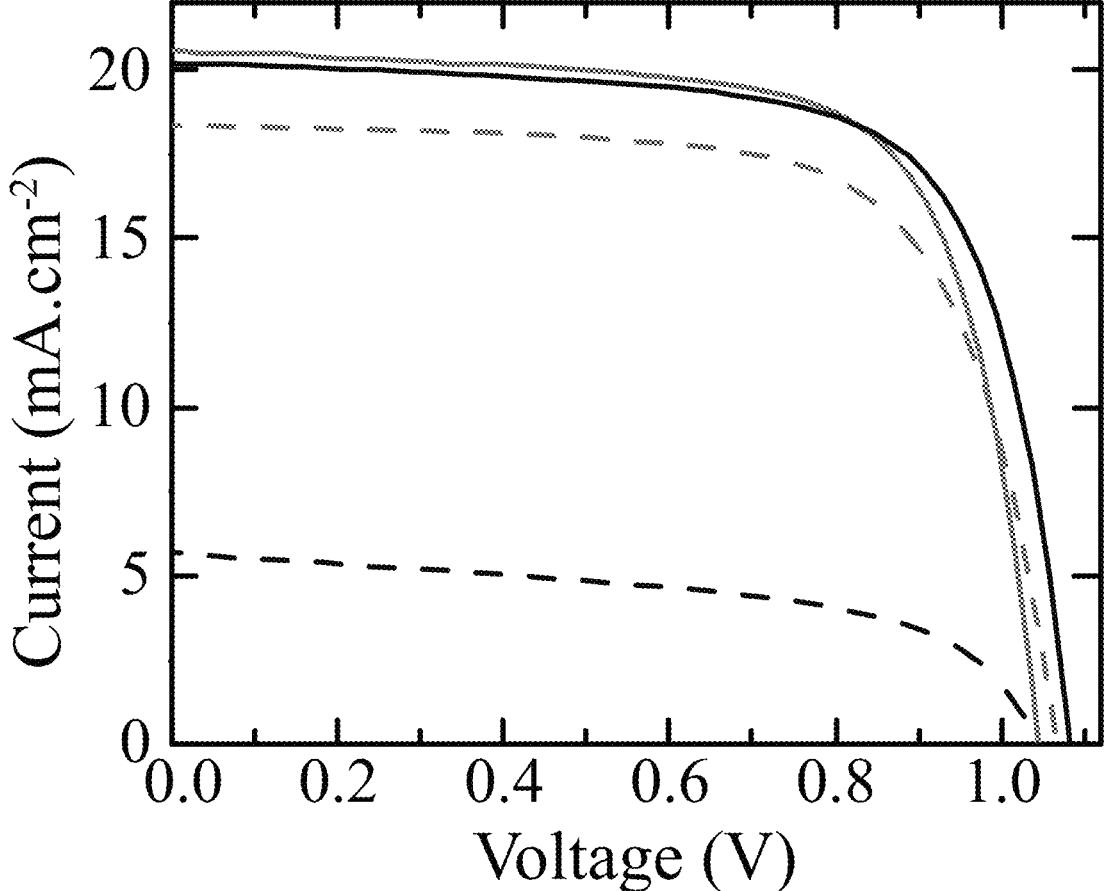
FIG. 13A illustrates J-V curves for PIN triple-cation devices without (black) and with (gray) $SiO_x$ moisture barriers before (solid) and after (dashed) 1 min dipping in DI water), according to some embodiments of the present disclosure.
Figure 13B:
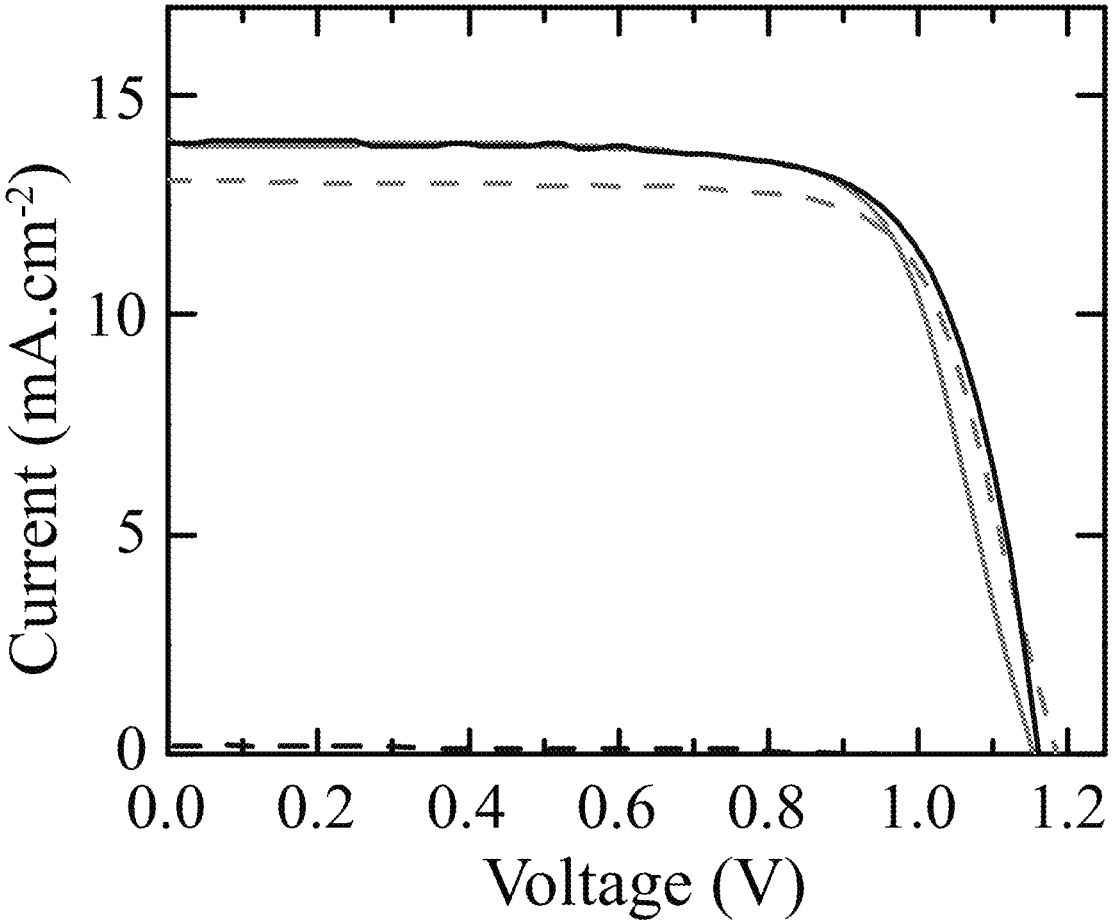
FIG. 13B illustrates J-V curves for NIP $CsPbI_2Br$ devices without (black) and with (gray) SiO before (solid) and after (dashed) 1 min dipping in DI water, according to some embodiments of the present disclosure.
Figure 13C:
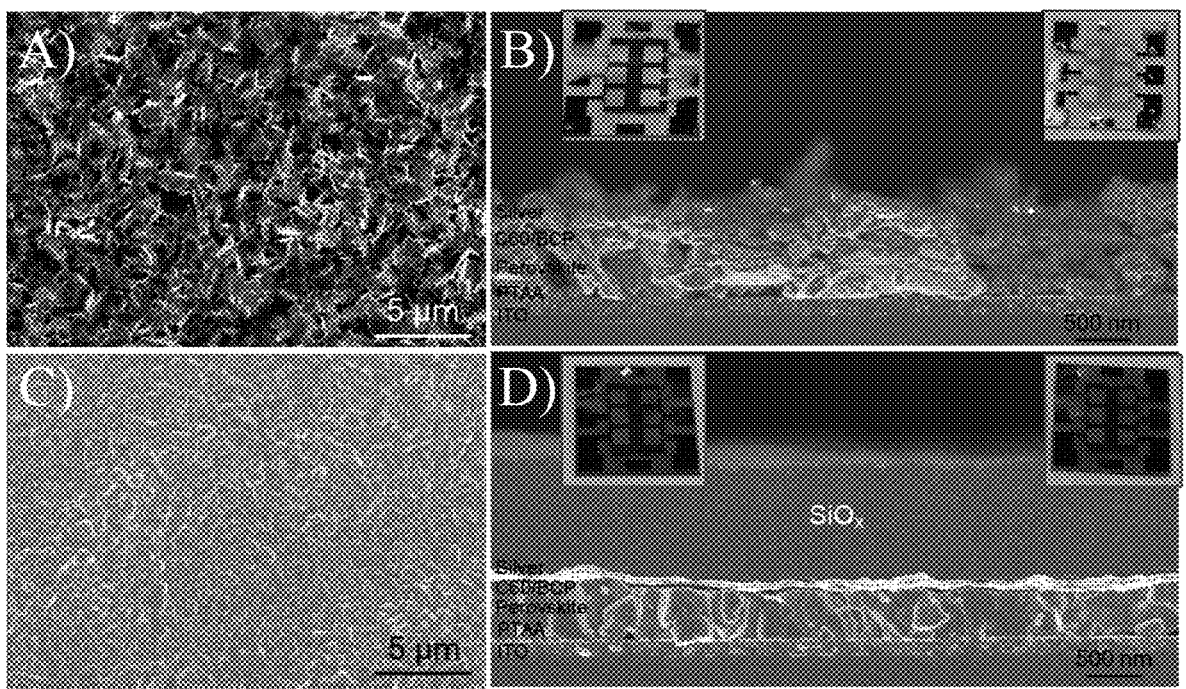
FIG. 13C illustrates: Panel A) Top-view, and Panel B) X-SEM images of water-dipped PIN device without $SiO_x$ and Panel C) top-view, and Panel D) X-SEM images of water-dipped PIN device with $SiO_x$, according to some embodiments of the present disclosure. Photographs of the cells before and after water-dipping are shown as insets.

FIGS. 13A-13C show the effect of DI water immersion on the J-V curves of PIN triple-cation and CsPbI$_2$Br cells, respectively. Although direct interaction of solar panels with water is not a realistic scenario, such a test takes the moisture tolerance aspect to the extreme. Here again, it was shown that SiO$_x$-capped PIN triple-cation and CsPbI$_2$Br cells retained ~90% of their initial PCEs after about 1 minute immersed in DI water (not shown in FIGS. 13A or 13B). The case of CsPbI$_2$Br device is particularly remarkable given its intrinsic intolerance to moisture. In fact, the bare CsPbI$_2$Br device denoted by the dashed black curve in FIG. 13B was completely damaged upon contact with water, while the protected cell retained its brown color and performance. SEM images in Panels A and B of FIG. 13C show the extent of damage on the PIN triple-cation cell upon contact with water. The SiO$_x$ barrier layer blocked any interaction of the cell with water and left it undamaged (see Panels C and D of FIG. 13C).

The design of such experiments is complicated since substrate edges and the electrode area that is contacted for J-V measurements provides ingress pathways to solvent molecules which can travel laterally and damage the cell. However, the fact that organic solvents (data not shown) are not able to immediately attack and damage the cells having the SiO$_x$ barrier layers suggests that a direct impact of solvents with the cells was blocked. Thus, one may expect a packaging strategy that combines SiO$_x$ with edge sealing to result in significantly longer submergence times. For example, a device may have a first SiO$_x$ barrier layer as described herein, covering essentially the entire top portion of a device, with a second barrier layer positioned onto the SiO$_x$ barrier layer, where the second barrier may include an established space grade encapsulant such as at least one of a silicone material and/or an ethylene-vinyl acetate (EVA). An example of a silicone barrier material is Dow product DC93-500, which is a low outgassing elastomer used to protect most electronics in space.

Similar immersion experiments were performed with organic solvent, specifically DMF. Since most of the per-ovskite ink formulations are based on DMF, the solvent is expected to completely dissolve the perovskite layer upon contact. Immersion in DMF is therefore one of the harshest tests to quantify resilience of a barrier layer technology for perovskites. Devices constructed of perovskite layers capped with SiO$_x$ barrier layers, remarkably, retained their dark black appearance, thereby indicating that the perovskite layer was successfully isolated from the DMF by the SiO$_x$ barrier layer.

Figure 14:
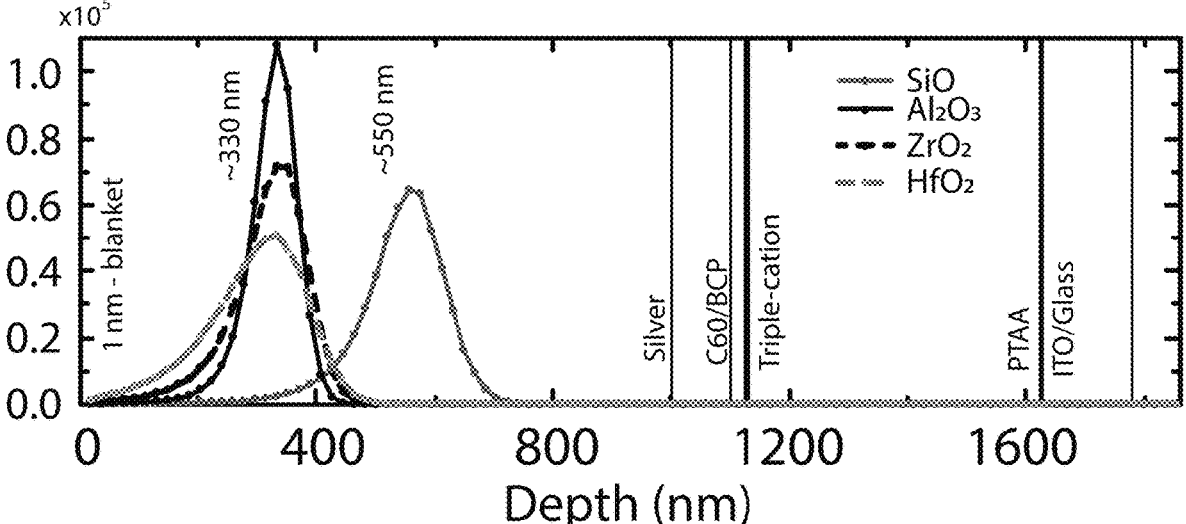
FIG. 14 illustrates proton radiation modeling results obtained for various 1 μm thick oxide proton barriers on PIN triple-cation devices, according to some embodiments of the present disclosure.

Finally, the theoretical analysis was extended to a library of other metal oxide barriers: Al$_2$O$_3$, ZrO$_2$, and HfO$_2$. These have higher mass densities than SiO$_x$ (2.13 g·cm$^{-3}$) and are therefore expected to behave as better proton barriers due to increased interaction with the incident protons. All of these layers efficiently block protons from entering the perovskite device stack, as determined from SRIM/TRIM simulations summarized in FIG. 14 for PIN devices like that shown in FIG. 7B for SiO$_x$. Indeed, it was determined that Al$_2$O$_3$, ZrO$_2$ and HfO$_2$ are more efficient proton barriers owing to lower proton stopping range of ~330 nm than SiO$_x$ (~550 nm). These layers can be deposited via atomic layer deposition (ALD) or by e-beam deposition.

Methods:

Materials: Lead (II) iodide (PbI$_2$; 99.99%) and lead (II) bromide (PbBr$_2$; >98.0%) were purchased from TCI America. Formamidinium iodide (FAI;) and methylammonium bromide (MABr;) were purchased from GreatCell Solar Materials. bis(trifluoromethane) sulfonimide lithium salt (Li-TFSI) was purchased from Alfa Aesar. Cesium iodide (CsI; 99.999%) and 4-tert-butylpyridine (tBP; 96%) was purchased from Sigma Aldrich. 2,2',7,7'-tetrakis(N,N-di-p-methoxyphenylamino) 9,9'-spirobifluorene (spiro-OMeTAD; ≥99.5%) was purchased from Lumtec, poly(tri-aryl amine) (PTAA; 5-20 kDa) was obtained from Solaris Chem, poly(9,9-bis(3'-(N,N-dimethyl)-N-ethylammoinium-propyl-2,7-fluorene)-alt-2,7-(9,9-dioctylfluorene))dibro-mide (PFN-Br) was purchased from 1-Material. SnO$_2$ colloidal dispersion was obtained from Alfa Aesar and diluted to 1.5% in DI water before use. C60, Bathocpurine (BCP) and all the solvents (dimethylformamide (DMF), dimethyl-sulfoxide (DMSO), chlorobenzene (CB), toluene, methanol) were obtained from Sigma Aldrich.

Triple-cation perovskite active layer fabrication: This procedure was common to both the NIP and PIN devices. PbI$_2$ (507 mg), PbBr$_2$ (73.4 mg), MABr (22.4 mg), FAI (172 mg) and CsI (15.6 mg) precursors were mixed in 1 mL DMF: DMSO solvent mixture (4:1 v: v) and vortexed to form a 1.26 M ink. The ink was filtered using a 0.45 mm nylon filter. A certain volume of the ink dropped on the substrate was spun at 1000 r.p.m for 10 s followed by 6000 r.p.m for 20 s. 150 µL CB was dropped in a continuous stream at the spinning substrates with 5 s remaining in the end of the spin cycle. This antisolvent rinse step changed the appearance of the spinning film from transparent to mild orange. After completion of the spin cycle, the substrate was immediately placed at a hot plate set at 100° C. for 60 mins. Within seconds of coming in contact with the hotplate, the film converts to the black perovskite phase.

Device fabrication: Quartz substrates (Ted Pella) with dimensions of 25.4 mm×25.4 mm×1 mm with ITO deposited in-house (sheet resistance ~15 Ω/□) were cleaned by sequential sonication in acetone (15 min) and isopropanol (15 min) purchased from Sigma Aldrich. Substrates were blow-dried with nitrogen followed by 10 min of UV-ozone.

For NIP devices, 150 µL SnO$_2$ colloid was dropped on each substrate followed by spin-coating at 3000 r.p.m for 15 s. The coated substrates were placed at a hotplate set at 150°

C. for 30 min. This was followed by a further 10 min UV-ozone after which the substrates were transferred to a $N_2$ glove box where perovskite active layer fabrication was completed. spiro-OMeTAD was next deposited by dynamically spinning 10 $\mu$L of spiro-OMeTAD solution at 5000 r.p.m for 15 s. This solution was made right before deposition by dissolving 36.1 mg spiro-OMeTAD, 14.4 $\mu$L tBP and 8.8 $\mu$L Li-TFSI (520 mg in 1 mL acetonitrile) in 0.5 mL CB.

For PIN devices, the UV-ozone cleaned substrates were immediately transferred to the $N_2$ glove box for PTAA deposition. 50 $\mu$L of PTAA solution (2 mg·mL$^{-1}$ in Toluene) was spin-coated at 6000 r.p.m for 30 s. The coated substrate was placed at a hot plate set at 100° C. for 10 min. This was followed by dynamic spinning of 50 $\mu$L PFN-Br solution (0.5 mg·mL$^{-1}$ in methanol) at 5000 r.p.m for 30 s. Perovskite active layer was next deposited.

Thermal evaporation: For NIP devices, 100 nm gold was evaporated at 0.5 Å·s$^{-1}$ for the first 10 nm and 2.0 Å·s$^{-1}$ for the remaining 90 nm. For PIN devices, 25 nm C60 (0.30 Å·s$^{-1}$), 6 nm BCP (0.15 Å·s$^{-1}$) and 100 nm silver (0.5 Å·s$^{-1}$ for the first 10 nm and 2.0 Å·s$^{-1}$ for the remaining 90 nm) were deposited.

For $SiO_x$-capped cells, 1000 nm SiO (i.e., silicon monoxide) granules were evaporated on the device stack at 0.5 Å·s$^{-1}$ for the first 10 nm, 2.0 Å·s$^{-1}$ for the next 100 nm and 5.0 Å·s$^{-1}$ for the remaining 890 nm. Evaporation was carried out at a base pressure of 10-7 Torr. Solar cells were held at room temperature and the substrate holder was actively cooled with water to avoid heating of the solar cells during evaporation. No oxygen was used during the evaporation. The starting material for depositing the oxide of silicon was silicon monoxide provided by the RD Mathis Company. Therefore, when assuming 100% transfer from the source boat to the device, the second layer 120 deposited onto the device was also silicon monoxide, SiO (x=1). In reality, something less than 100% transfer was achieved, meaning that the average stoichiometry of the second layer 120 was approximately SiO (x=1), with a distribution around x equal to 1, $0 \leq x \leq 2$.

The density of the deposited SiO was determined as follows. The $SiO_x$ film was deposited via thermal evaporation on a perovskite solar cell. The cell was weighed before and after the $SiO_x$ deposition to ascertain the weight of the oxide. Thickness of the deposited $SiO_x$ film=1 $\mu$m=10$^{-4}$ cm. Planar dimensions of the deposited $SiO_x$ film=2.54 cm×2.54 cm. Volume of the deposited $SiO_x$ film=2.54×2.54×10$^{-4}$ cm$^3$. Mass of the deposited $SiO_x$ film measuring using mass balance=1.45 mg. These yield a density=(1.45×10$^{-3}$ g)/(2.54×2.54×10$^{-4}$ cm$^3$) of about 2.25 g·cm$^{-3}$, which is very close to the density of 2.13 g·cm$^{-3}$ corresponding to silicon monoxide (SiO).

Figure 15:
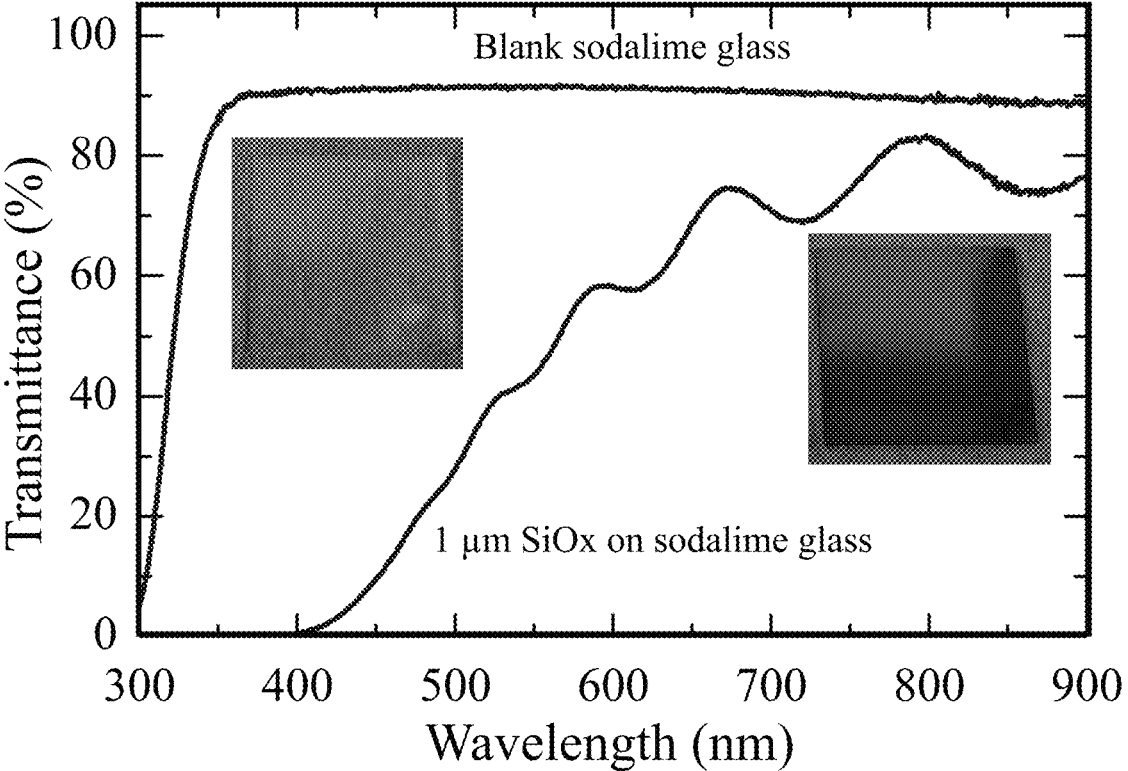
FIG. 15 illustrates light transmissivity through a bare glass layer and one coated with SiO, according to some embodiments of the present disclosure.

Further, the SiO layer was characterized by measuring its transmissivity after its deposition onto a sodalime glass slide. This is illustrated in FIG. 15. These spectra were collected using UV-vis spectroscopy. The measured optical absorbance was converted into optical transmittance. In the current design, the $SiO_x$ layer is deposited atop the solar cell and does not interact with the incident photons, which are incident from the sodalime glass surface. The optical transmittance of the $SiO_x$ is therefore not important in this device design.

J-V characterization: Solar cells were measured at room temperature in a $N_2$ glove box with a source meter (Keithley 2420) using a solar simulator (Newport, Oriel Class AAA, 94063A) at 100 mW·cm$^{-2}$ illumination (AM 1.5G). The simulator was calibrated using an NREL-calibrated Si photodiode and a KG2 filter. Devices were measured in reverse scan (1.4 V to −0.2 V) and forward scan (−0.2 V to 1.4 V) at a scan speed of 0.464 V·s$^{-1}$ and step size of 0.02 V. Active area of the devices was defined by a metal aperture (0.058 cm$^2$).

SEM characterization: SEM imaging was performed on a Hitachi 4800 Field Emission Electron Microscope. Samples were mounted with carbon paint, and imaging executed at working distance range of 5-8 mm, as recommended by the vendor. Due to the volatility of perovskites, conservative imaging parameters were utilized, with lower energy and lower current settings. In cross sectional orientation, a thin layer of gold was applied to mitigate charging effects.

SRIM simulations: SRIM simulations were performed considering 100,000 protons using the 'full damage cascade' calculation mode. Following device structures were considered:

NIP device without $SiO_x$:
Au (100 nm)/SPIRO (200 nm)/Cs$_{0.05}$(MA$_{0.17}$FA$_{0.83}$)$_{0.95}$Pb(I$_{0.83}$Br$_{0.17}$)$_3$ (500 nm)/SnO$_2$ (50 nm)/ITO (150 nm)/ Glass (70 nm).

NIP device with $SiO_x$:
$SiO_x$ (1000 nm)/Au (100 nm)/SPIRO (200 nm)/Cs$_{0.05}$ (MA$_{0.17}$FA$_{0.83}$)$_{0.95}$Pb(I$_{0.83}$Br$_{0.17}$)$_3$ (500 nm)/SnO$_2$ (50 nm)/ITO (150 nm)/Glass (70 nm).

PIN device without $SiO_x$:
Ag (100 nm)/BCP (6 nm)/C60 (25 nm)/Cs$_{0.05}$ (MA$_{0.17}$FA$_{0.83}$)$_{0.95}$Pb(I$_{0.83}$Br$_{0.17}$)$_3$ (500 nm)/PTAA (5 nm)/ITO (150 nm)/Glass (70 nm).

PIN device with $SiO_x$:
$SiO_x$ (1000 nm)/Ag (100 nm)/BCP (6 nm)/C60 (25 nm)/ Cs$_{0.05}$(MA$_{0.17}$FA$_{0.83}$)$_{0.95}$Pb(I$_{0.83}$Br$_{0.17}$)$_3$ (500 nm)/ PTAA (5 nm)/ITO (150 nm)/Glass (70 nm).

Proton were irradiated from the metal electrode side. A low glass substrate thickness was considered to speed up calculations.

Mass densities used were: $SiO_x$=2.13 g·cm$^{-3}$, Al$_2$O$_3$=3.95 g·cm$^{-3}$, ZrO$_2$=5.68 g·cm$^{-3}$, HfO$_2$=9.68 g·cm$^{-3}$, Au=19.31 g·cm$^{-3}$, SPIRO=1.40 g·cm$^{-3}$, PTAA=1.40 g·cm$^{-3}$, C60=1.65 g·cm$^{-3}$, BCP=1.2 g·cm$^{-3}$, Cs$_{0.05}$(MA$_{0.17}$ FA$_{0.83}$)$_{0.95}$Pb(I$_{0.83}$Br$_{0.17}$) 3=4.30 g·cm$^{-3}$, SnO$_2$=6.95 g·cm$^{-3}$, ITO=7.20 g·cm$^{-3}$, Glass=2.53 g·cm$^{-3}$.

Displacement energies used were: Au=25 eV, C=28 eV, H=10 eV, N=28 eV, O=28 eV, Cs=25 eV, Pb=25 eV, I=25 eV, Br=25 eV, Si=15 eV, In=25 eV, Sn=25 eV, Al=25 eV, Zr=25 eV, Hf=25 eV.

EXAMPLES

Example 1. A solar cell comprising: a first layer comprising a semiconductor; and a second layer comprising at least one of an oxide, a carbide, a nitride, a fluoride, or a sulfide, wherein: the second layer covers a surface of the first layer, the second layer has a thickness between about 400 nm and about 10 $\mu$m, and the solar cell retains at least 95% of a starting power-conversion-efficiency (PCE) after exposure to a proton fluence of about 1E15 cm$^{-2}$ for protons having an energy between greater than zero KeV per proton and less than or equal to 0.05 KeV per proton.

Example 2. The solar cell of claim 1, wherein the solar cell retains at least 99% of the starting PCE.

Example 3. The solar cell of either Example 1 or Example 2, wherein the semiconductor comprises at least one of perovskite, silicon, CdTe, a CIGS alloy, a III-V alloy, or an organic material.

Example 4. The solar cell of any one of Examples 1-3, wherein: the semiconductor comprises a perovskite and the perovskite comprises a crystalline structure defined by ABX$_3$, A comprises a first cation, B comprises a second cation, and X comprises an anion.

Example 5. The solar cell of any one of Examples 1-4, wherein A comprises at least one of cesium, formamidinium, or an alkylammonium.

Example 6. The solar cell of any one of Examples 1-5, wherein the alkylammonium comprises methylammonium.

Example 7. The solar cell of any one of Examples 1-6, wherein B comprises at least one of lead or tin.

Example 8. The solar cell of any one of Examples 1-7, wherein X comprises a halide.

Example 9. The solar cell of any one of Examples 1-8, wherein the semiconductor is in the form of a colloidal quantum dot.

Example 10. The solar cell of any one of Examples 1-9, wherein the carbide comprises at least one of a transition metal carbide or a metalloid carbide.

Example 11. The solar cell of any one of Examples 1-10, wherein the transition metal carbide comprises at least one of a titanium carbide, a zirconium carbide, a hafnium carbide, a vanadium carbide, a niobium carbide, a tantalum carbide, a chromium carbide, a molybdenum carbide, or a tungsten carbide.

Example 12. The solar cell of any one of Examples 1-11, wherein the metalloid carbide comprises at least one of a silicon carbide, a germanium carbide, or a tellurium carbide.

Example 13. The solar cell of any one of Examples 1-12, wherein the nitride comprises at least one of a silicon nitride or a gallium nitride.

Example 14. The solar cell of any one of Examples 1-13, wherein the sulfide comprises at least one of a zinc sulfide, a manganese sulfide, a cadmium sulfide, a lead sulfide, or an indium sulfide.

Example 15. The solar cell of any one of Examples 1-14, wherein the fluoride comprises magnesium fluoride.

Example 16. The solar cell of any one of Examples 1-15, wherein the oxide comprises at least one of a silicon oxide, an aluminum oxide, a hafnium dioxide, or a zirconium oxide.

Example 17. The solar cell of any one of Examples 1-16, wherein the silicon oxide comprises SiO$_x$, where $0 \leq x \leq 2$.

Example 18. The solar cell of any one of Examples 1-17, wherein x is between 0.8 and 1.2, inclusively.

Example 19. The solar cell of any one of Examples 1-18, wherein x is between 0.99 and 1.01, inclusively.

Example 20. The solar cell of any one of Examples 1-19, wherein the SiO$_x$ has density between about 2.1 g/cm$^3$ and about 2.3 g/cm$^3$, inclusively.

Example 21. The solar cell of any one of Examples 1-20, wherein the oxide comprises at least one of SiO, Al$_2$O$_3$, ZrO$_2$, or HfO$_2$.

Example 22. The solar cell of any one of Examples 1-21, further comprising: a third layer, wherein: the third layer is positioned between the first layer and the second layer, and and the third layer comprises a polymer.

Example 23. The solar cell of any one of Examples 1-22, wherein the polymer comprises at least one of a silicone material or ethylene-vinyl acetate.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A solar cell comprising:
a layer comprising a perovskite;
a metal layer; and
a first barrier layer consisting of at least one metal oxide, wherein:
the first barrier layer is in direct contact with the metal layer,
the metal oxide comprises SiO$_x$,
x is between 0.8 and 1.2, inclusively, and
the first barrier layer has a thickness between 400 nm and 3 μm.

2. The solar cell of claim 1, further comprising at least one of silicon, CdTe, a CIGS alloy, a III-V alloy, or an organic material.

3. The solar cell of claim 1, wherein:
the perovskite comprises a crystalline structure defined by ABX$_3$,
A comprises a first cation, B comprises a second cation, and X comprises an anion.

4. The solar cell of claim 1, wherein the perovskite is in the form of a colloidal quantum dot.

5. The solar cell of claim 1, further comprising a second barrier layer comprising a carbide.

6. The solar cell of claim 1, further comprising a second barrier layer comprising a nitride.

7. The solar cell of claim 1, further comprising a second barrier layer comprising a sulfide.

8. The solar cell of claim 1, further comprising a second barrier layer comprising a fluoride.

9. The solar cell of claim 1, further comprising a second barrier layer comprising at least one of an aluminum oxide, a hafnium dioxide, or a zirconium oxide.

10. The solar cell of claim 1, wherein x is between 0.99 and 1.01, inclusively.

11. The solar cell of claim 1, wherein the SiO$_x$ has a density between about 2.1 g/cm$^3$ and about 2.3 g/cm$^3$, inclusively.

12. The solar cell of claim 1, wherein the first barrier layer further comprises at least one of Al$_2$O$_3$, ZrO$_2$, or HfO$_2$.

13. The solar cell of claim 1, wherein the metal layer comprises at least one of silver, gold, or a combination thereof.

14. The solar cell of claim 1, further comprising a hole-transport layer (HTL), wherein the HTL is positioned between the metal layer and the layer comprising the perovskite.

15. The solar cell of claim 1, further comprising an electron-transport layer (ETL), wherein the ETL is positioned between the metal layer and the layer comprising the perovskite.

16. The solar cell of claim 1, wherein the first barrier layer is free of organic material.

17. The solar cell of claim 1, further comprising at least 95% retention of a starting power-conversion-efficiency (PCE) after exposure of the first barrier layer to a proton fluence of about $1E15$ $cm^{-2}$ for protons having an energy between greater than zero KeV per proton and less than or equal to 0.05 KeV per proton.

\* \* \* \* \*